United States Patent
Nakano et al.

(10) Patent No.: US 7,116,117 B2
(45) Date of Patent: Oct. 3, 2006

(54) CAPACITIVE SENSOR

(75) Inventors: Ryuichi Nakano, Wako (JP); Hirohide Suda, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 11/059,489

(22) Filed: Feb. 15, 2005

(65) Prior Publication Data

US 2005/0179415 A1  Aug. 18, 2005

(30) Foreign Application Priority Data

Feb. 16, 2004 (JP) ............................ 2004-038584
Feb. 16, 2004 (JP) ............................ 2004-038972

(51) Int. Cl.
*G01R 27/26* (2006.01)
(52) U.S. Cl. ................. 324/688; 324/658; 324/661
(58) Field of Classification Search ............... 324/661, 324/688, 658
See application file for complete search history.

(56) References Cited

U.S. PATENT DOCUMENTS

| 5,621,290 A | * | 4/1997 | Heller et al. | ............... 318/466 |
| 6,593,755 B1 | * | 7/2003 | Rosengren | ................... 324/677 |
| 6,700,393 B1 | * | 3/2004 | Haag et al. | ................. 324/674 |
| 2004/0145378 A1 | * | 7/2004 | Shoji et al. | ................. 324/663 |

FOREIGN PATENT DOCUMENTS

JP  2001-32628  2/2001

* cited by examiner

*Primary Examiner*—Anjan Deb
*Assistant Examiner*—Amy He
(74) *Attorney, Agent, or Firm*—Hamre, Schumann, Mueller & Larson, PC

(57) ABSTRACT

A capacitive sensor includes: a first sensing electrode connected to a first reference capacitor in which is stored reference electric charge; a second sensing electrode connected to a second reference capacitor in which is stored reference electric charge; and a shield electrode to which is applied electric potential equal to that of the first sensing electrode and the second sensing electrode. The first sensing electrode positions adjacent to a detecting surface of the capacitive sensor, and the second sensing electrode positions opposite to the detecting surface in such a manner that the first and second sensing electrodes are spaced apart and facing to each other. The shield electrode is configured to partly expose the first and second sensing electrodes on the side of the detecting surface, and the shield electrode extends toward the detecting surface beyond the first sensing electrode.

11 Claims, 19 Drawing Sheets

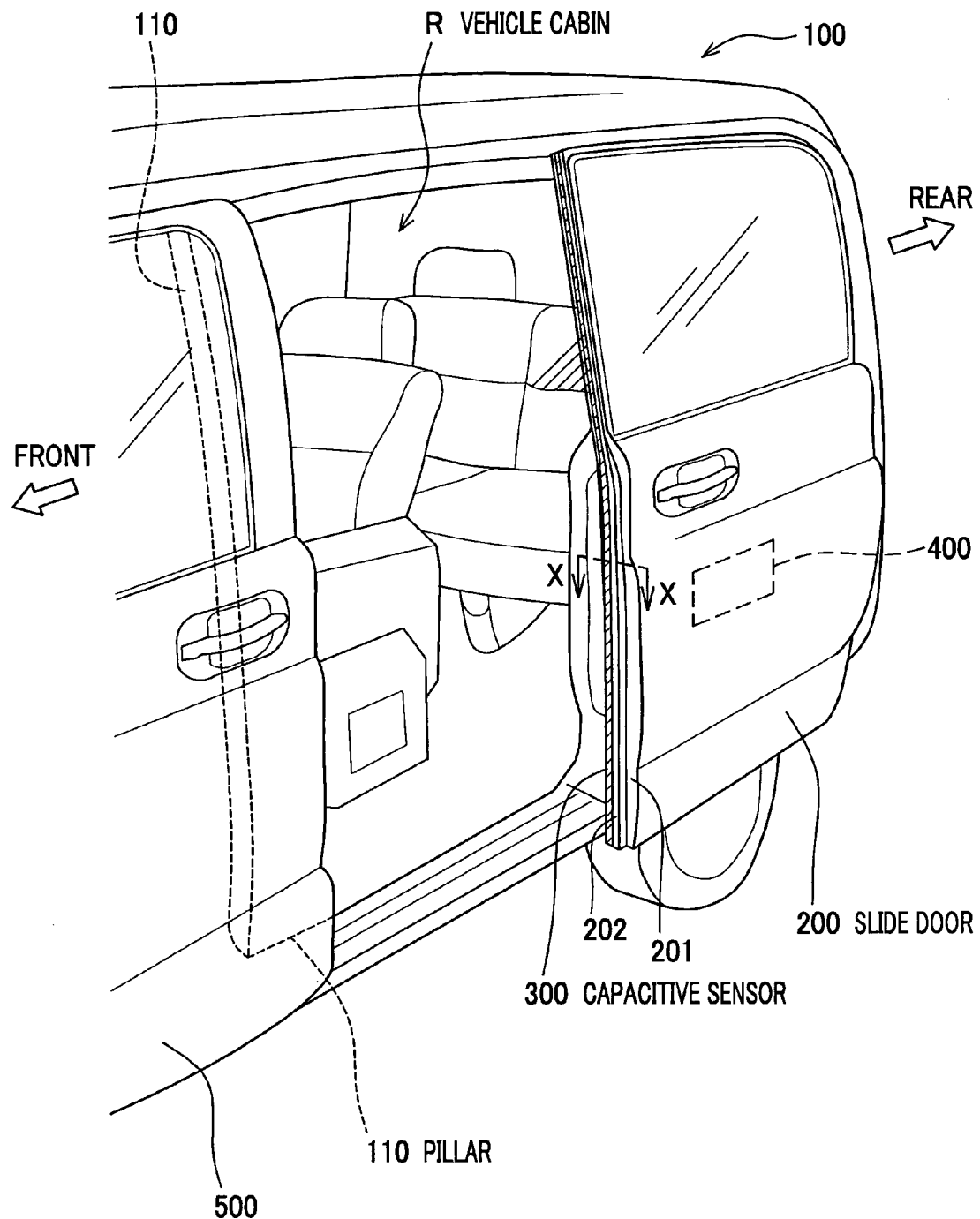

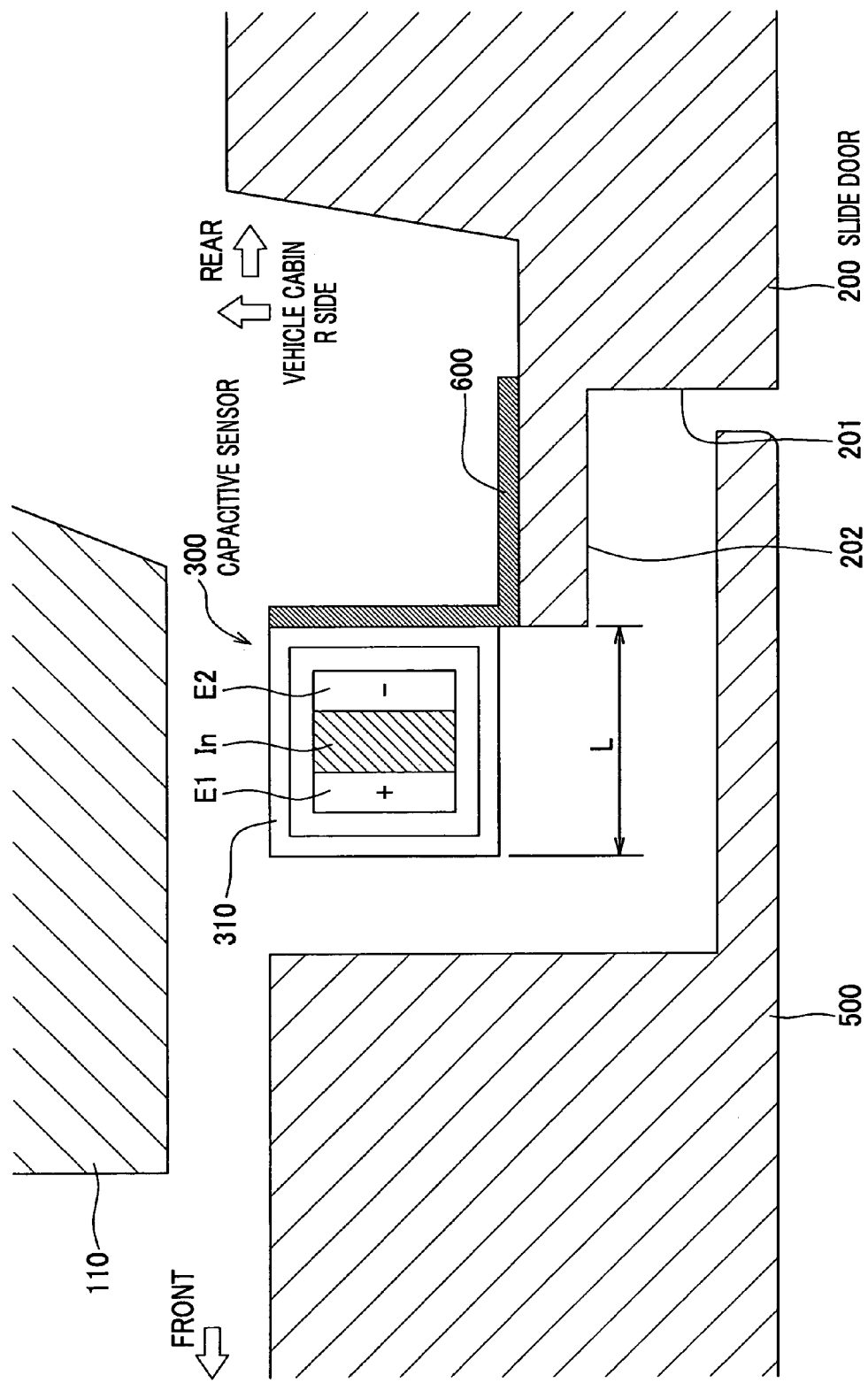

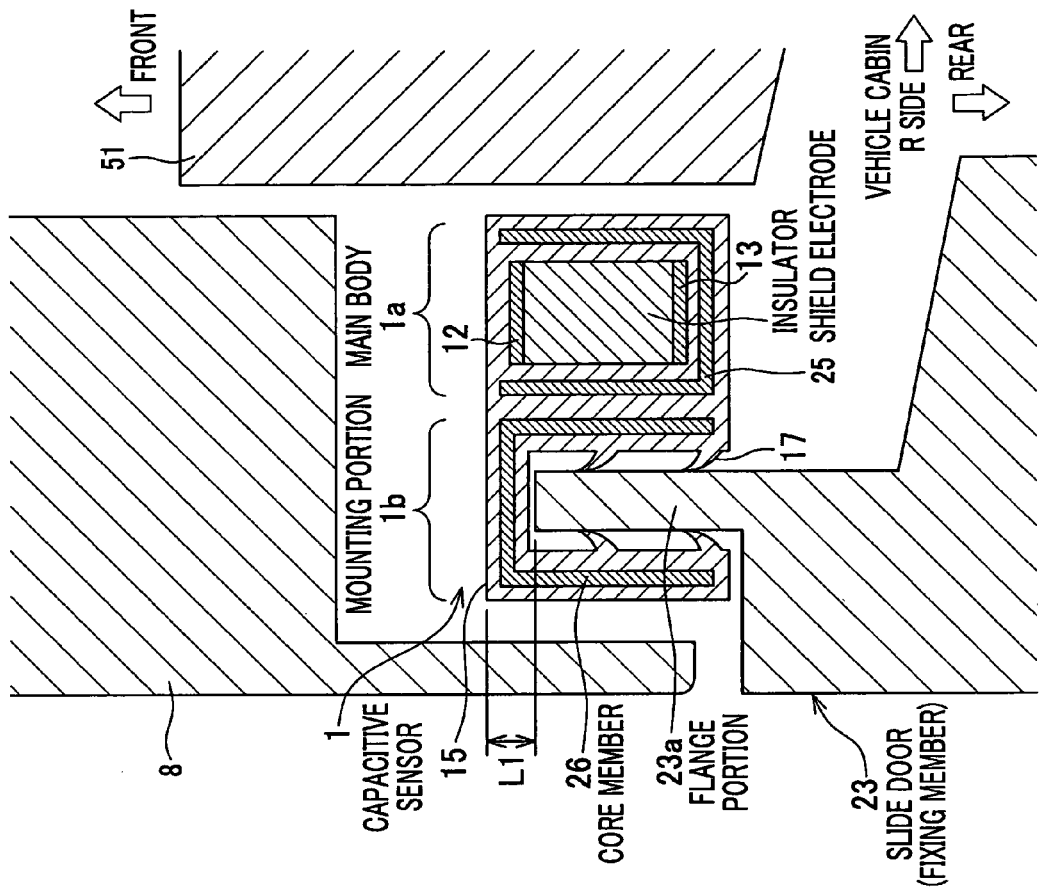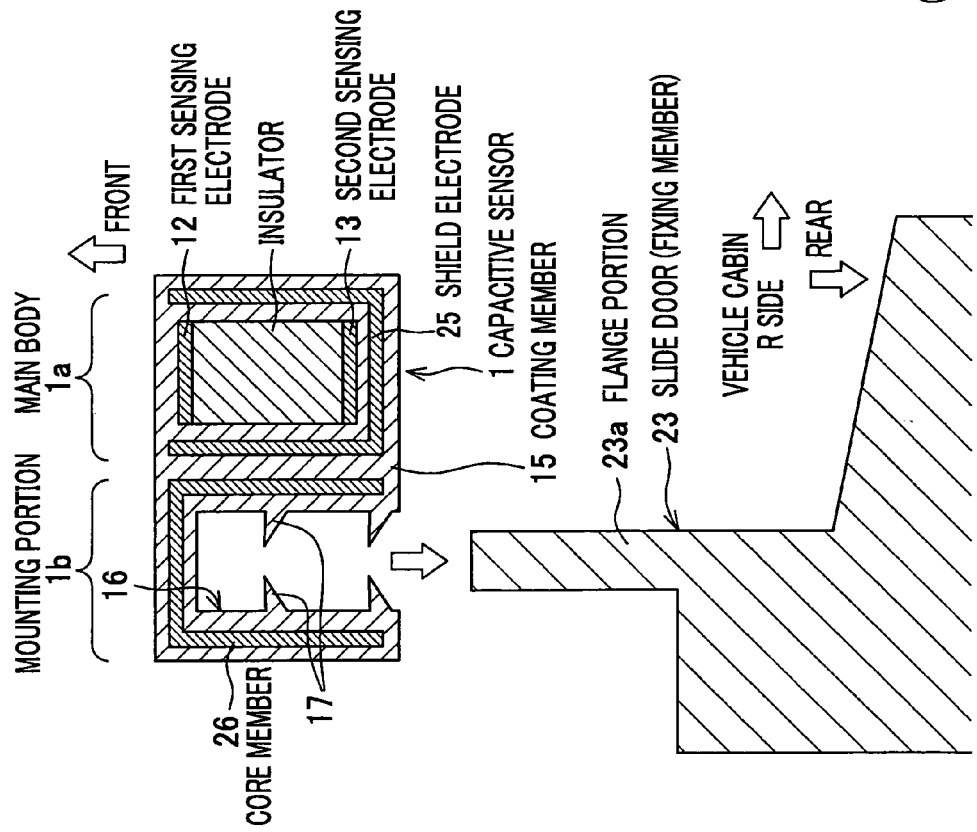

FIG. 13
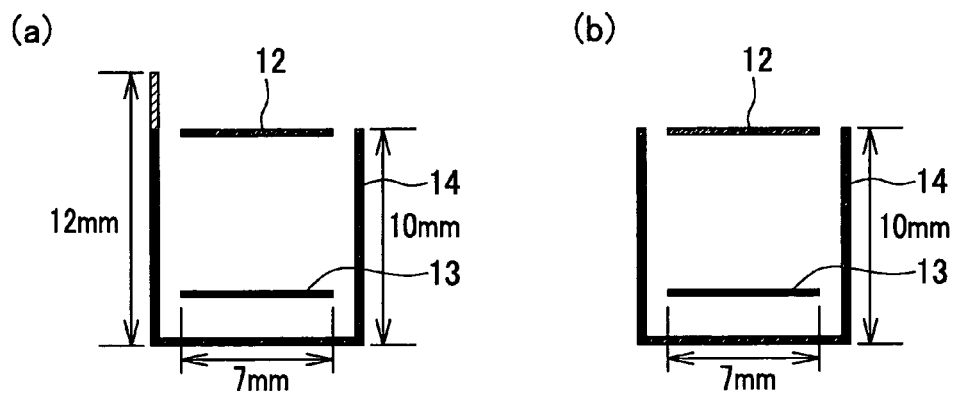
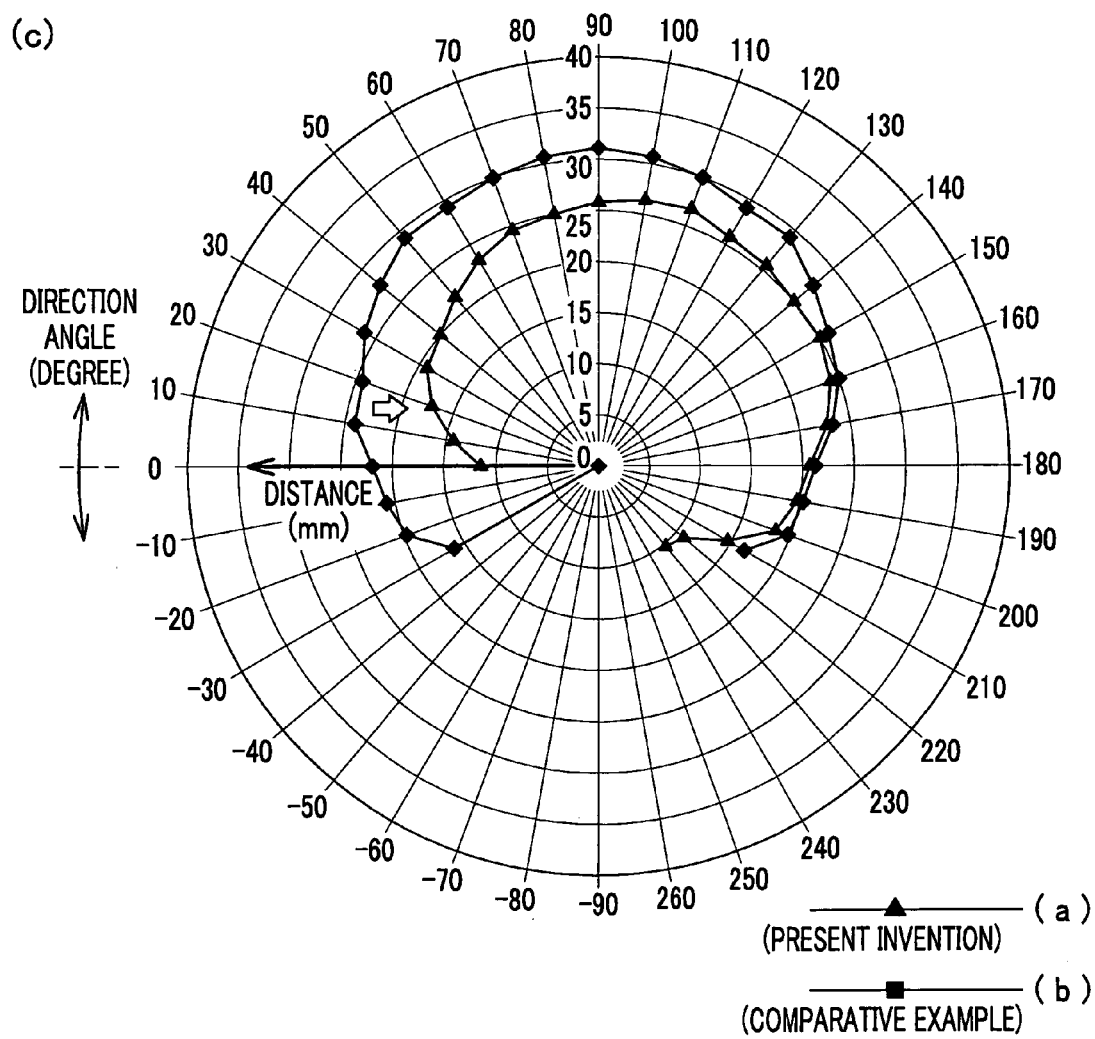

FIG. 18
(a)
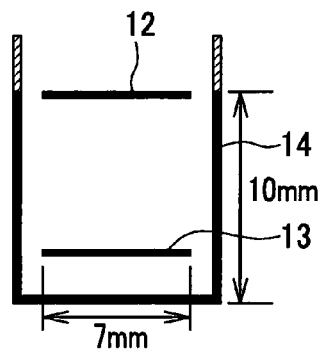
(d)
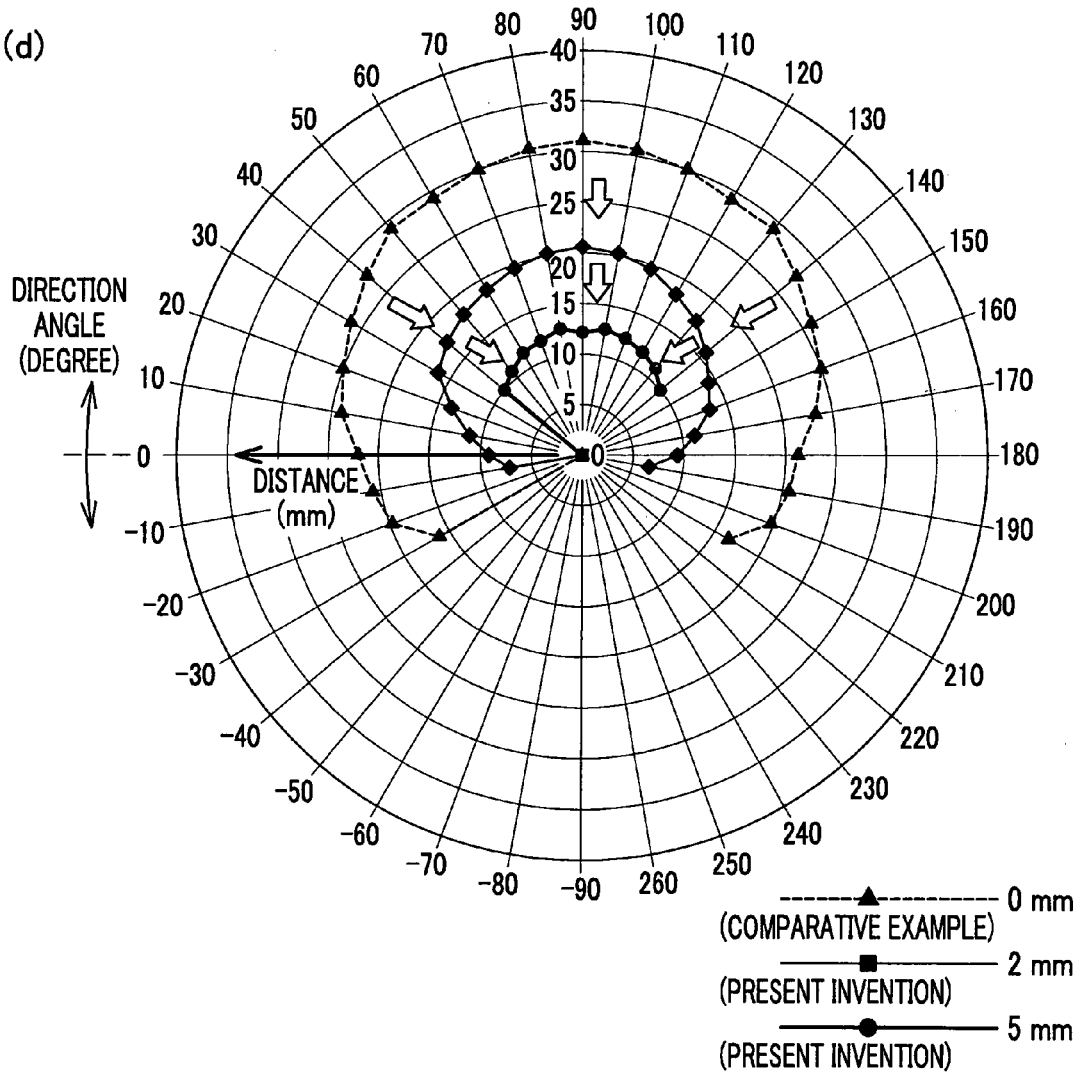

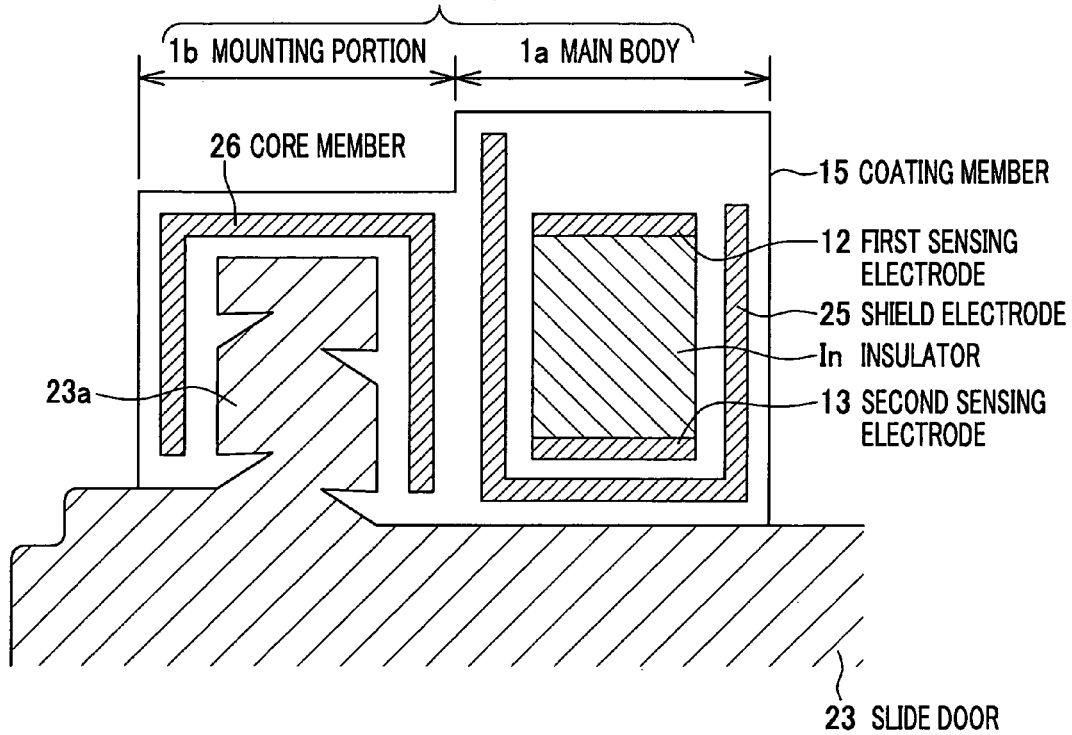
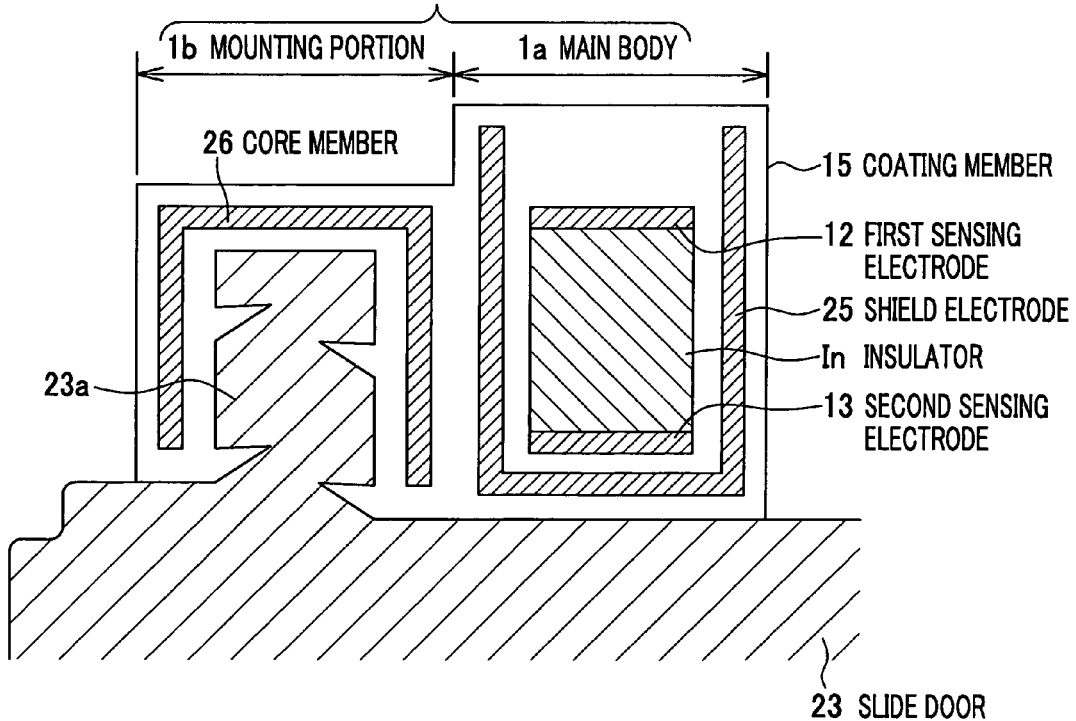

CAPACITIVE SENSOR

INCORPORATION BY REFERENCE

The present application claims priority to Japanese patent application Nos. 2004-038584 and 2004-038972, the contents of which are hereby incorporated by reference.

BACKGROUND OF THE INVENTION

The present invention generally relates to a capacitive sensor, and more particularly to a capacitive sensor capable of detecting an adjacent human body.

Entrapment prevention device is conventionally known, for example, by Japanese Laid-open Patent Application No. 2001-32628 (paragraphs [0002] to [0026], and FIG. 1). Entrapment prevention apparatus is employed to prevent the entrapment of a hand or fingers between a moving member such as a power slide door or power window of a vehicle and a stationary member such as a pillar or window frame for receiving the moving member. The entrapment prevention apparatus includes a capacitive sensor for detecting a human body, and stops or moves the moving member in the reverse direction based on the detection signal.

As shown in FIG. 1A, a capacitive sensor generally includes a sensing electrode E1, an earth electrode E2, an insulator In interposed between the sensing electrode E1 and the earth electrode E2, and a coating member surrounding the peripheries of the sensing electrode E1, the earth electrode E2 and the insulator In and made of an insulating material. The capacitive sensor is positioned, for example, at the end surface of the moving member that faces to the stationary member.

In this capacitive sensor, as shown in FIG. 1B, electric charge q is supplied to the sensing electrode E1 through an oscillation circuit and an output amplifier. To be more specific, the sensing electrode E1 and the earth electrode E2 form a capacitor, and electric potential v outputted through a detection amplifier is given by the following equation (1).

$$v=q/(Ca+Cb) \quad (1)$$

where q is quantity of electricity to be stored in the capacitive sensor (capacitor), Ca is electrostatic capacity of the capacitive sensor, and Cb is electrostatic capacity between the capacitive sensor and the earth.

When a human body approaches the capacitive sensor, the electric potential v varies according to the change in electrostatic capacity between the capacitive sensor and the human body. In this instance, the electric potential v is given by the following equation (2).

$$v=q/(Ca+Cb+Cc) \quad (2)$$

where each of q, Ca and Cb is the same as that in the equation (1), and Cc is electrostatic capacity between the capacitive sensor and the human body.

Therefore, Cc increases as the human body becomes closer to the capacitive sensor, and the electric potential v outputted through the detection amplifier becomes smaller as a result. The capacitive sensor detects a human body based on a change of the electric potential v.

However, as shown in FIG. 1C, there may be a possibility that due to rainfall a water droplet W sticks around the periphery of the sensing electrode E1 and the earth electrode E2 of the capacitive sensor, for example, on the coating member. Because the capacitive sensor has the earth electrode E2, if a water droplet W sticks to the coating member, the electrostatic capacity Ca of the capacitive sensor increases under the influence of the electrostatic capacity Cw of the water droplet W.

As is apparent from the equation (2), an increase of the electrostatic capacity Ca causes a decrease in the electric potential v of the sensing electrode E1. In other words, if a water droplet sticks to the capacitive sensor, the capacitive sensor operates incorrectly as if it detects a human body.

FIG. 2 shows an example in which the capacitive sensor is arranged at a power slide door of the vehicle. As seen in FIG. 2, some of the conventional vehicles are provided with a so-called power slide door, in which a door drive device 400 having a motor (not shown) as a drive source moves a slide door 200 in the forward and rearward direction to automatically open and close the slide door 200. The conventional door drive device 400 may be classified into two types: one type including a manipulation means provided at the driver seat or near the door handle so that when the user manipulates the manipulation means, the drive source is actuated to automatically open or close the slide door 200; and the other type for automatically closing the slide door 200 after the slide door 200 is manually moved for a certain distance.

Since the door drive device 400 of these types automatically closes the slide door 200, a passenger or a luggage may be caught between the slide door 200 and the pillar 110 or between the slide door 200 and the front door 500. For this reason, the slide door 200 is typically provided with an entrapment prevention apparatus (not shown) using a capacitive sensor 300 to prevent an entrapment of the slide door 200.

FIG. 3 is an enlarged sectional view taken along the line X—X of FIG. 2.

As shown in FIG. 3, the capacitive sensor 300 generally includes a sensing electrode E1, an earth electrode E2, an insulator In interposed between the sensing electrode E1 and the earth electrode E2, and a coating member 310 surrounding the peripheries of the sensing electrode E1, the earth electrode E2 and the insulator In and made of an insulating material.

As seen in FIG. 3, the capacitive sensor 300 is fixed to a flange portion 202 formed at a front side portion (front end 201) of the slide door 200 through a bracket 600. To be more specific, the bracket 600 having an L-shaped section as viewed from the top is fixed to the flange portion 202 at the interior side of the slide door 200, so that the capacitive sensor 300 is fixed to the slide door 200 within the interior of the vehicle cabin R.

However, the conventional capacitive sensor 300 is fixed to the flange portion 202 formed at the front end 201 of the slide door 200 through the bracket 600, leading to a protrusion of the length L, which corresponds to the dimension of the capacitive sensor 300 (sensor protrusion dimension), from the front end 201 of the slide door 200. By this protrusion, when the slide door 200 moves forwardly, the capacitive sensor 300 becomes closer to the front door 500. In the case where the entrapment threshold value of the capacitive sensor 300 is set to be lower in consideration of safety, the capacitive sensor 300 too sensitively detects an object, leading to a detection error of the capacitive sensor 300.

There is also a drawback in that the protruding arrangement of the capacitive sensor 300 from the front end 201 of the slide door 200 detracts from the appearance of the vehicle.

Further, since the capacitive sensor 300 is fixed to the slide door 200 through the bracket 600, fastening members such as screws are required to fix the bracket 600 against the capacitive sensor 300 and the slide door 200. This results in a drawback that the number of parts or the number of manufacturing processes increases.

In one aspect, the present invention seeks to provide a capacitive sensor and an entrapment prevention apparatus which can prevent a detection error of the capacitive sensor caused by a water droplet sticking to the periphery of the sensor.

In another aspect, the present invention also seeks to provide a capacitive sensor which can minimize the sensor protrusion dimension when the capacitive sensor is fixed to a fixing member and which can ease the attachment of the capacitive sensor to the fixing member.

SUMMARY OF THE INVENTION

It is a first aspect of the present invention to provide a capacitive sensor including: a first sensing electrode connected to a first reference capacitor in which is stored reference electric charge; a second sensing electrode connected to a second reference capacitor in which is stored reference electric charge; and a shield electrode to which is applied electric potential equal to that of the first sensing electrode and the second sensing electrode; wherein the first sensing electrode positions adjacent to a detecting surface of the capacitive sensor, and the second sensing electrode positions opposite to the detecting surface in such a manner that the first and second sensing electrodes are spaced apart and facing to each other, wherein the shield electrode is configured to partly expose the first and second sensing electrodes on the side of the detecting surface, and wherein the shield electrode extends toward the detecting surface beyond the first sensing electrode.

According to this capacitive sensor, the first sensing electrode is connected to the first reference capacitor and the electrostatic capacity between the first sensing electrode and the first reference capacitor is equal to the electrostatic capacity of the first reference capacitor. The quantity of electricity between the first sensing electrode and the first reference capacitor is equal to the reference quantity of electricity stored in the first reference capacitor. Also, the second sensing electrode is connected to the second reference capacitor and the electrostatic capacity between the second sensing electrode and the second reference capacitor is equal to the electrostatic capacity of the second reference capacitor. The quantity of electricity between the second sensing electrode and the second reference capacitor is equal to the reference quantity of electricity stored in the second reference capacitor.

In this capacitive sensor, when the object to be detected having a stray capacitance (i.e. a human body or the like (hereinafter referred to as a "human body" for short.)) approaches, electrostatic capacity is induced between the human body and the first sensing electrode and also between the human body and the second sensing electrode. The induced electrostatic capacity C is given by the following equation (3).

$$C = \in \cdot S/D \quad (3)$$

where $\in$ is the dielectric constant of air, S indicates the electrode area of the first and second sensing electrodes, and D is a distance between the human body and the first and the second sensing electrodes.

In this capacitive sensor, since the first sensing electrode is arranged at the detecting surface side and the second sensing electrode is arranged at the opposite side of the detecting surface in such a manner that the first and second sensing electrodes are spaced apart and facing to each other, the distance between the human body and the first sensing electrode is smaller than the distance between the human body and the second sensing electrode. Therefore, according to the equation (3), the electrostatic capacity between the human body and the first sensing electrode becomes greater than the electrostatic capacity between the human body and the second sensing electrode. In other words, the electric potential of the first sensing electrode becomes smaller than the electric potential of the second sensing electrode as prepared by the following equation (4).

$$V = Q/C \quad (4)$$

where Q is the quantity of electricity stored in the first and second reference capacitors, respectively, and C indicates the electrostatic capacity between the human body and the first sensing electrode and between the human body and the second sensing electrode, respectively.

Therefore, if a difference value between the electric potential of the first sensing electrode and the electric potential of the second sensing electrode is equal to or greater than a predetermined threshold difference value, it can be determined that a human body approaches the capacitive sensor. This enables the capacitive sensor to detect a human body.

Further, unlike the conventional capacitive sensor, the capacitive sensor according to the present invention does not include an earth electrode. Therefore, even if a water droplet sticks to the capacitive sensor during the detection of a human body, a change in the electrostatic capacity of the capacitive sensor that is caused by the water droplet is very small because the distance between the water droplet and the earth is large. This capacitive sensor can prevent a detection error caused by the water droplet sticking to the periphery of the sensor.

The capacitive sensor according to the present invention detects a human body by detecting the difference value between the electric potential of the first sensing electrode and the electric potential of the second sensing electrode. Therefore, a change in the electric potential of the first sensing electrode and a change in the electric potential of the second sensing electrode, which are caused by a water droplet sticking to the sensor, can be compensated to each other by the detection of the difference value. This capacitive sensor can prevent a detection error caused by the water droplet sticking to the periphery of the sensor.

According to this capacitive sensor, the shield electrode partly surrounds the first and second sensing electrodes except for the detecting surface, and the electric potential same as that of the first and second sensing electrodes is applied to the shield electrode. When a human body approaches the capacitive sensor from the shield electrode side, electrostatic capacity is induced between the shield electrode and the human body. However, electrostatic capacity is not induced between the first and second sensing electrodes and the human body. In other words, even if a human body approaches the capacitive sensor from other than the detecting surface, the capacitive sensor does not detect the human body.

Further, since the electric potential of the shield electrode is equal to the electric potential of the first and second sensing electrodes, the electrostatic capacity between the shield electrode and the first and second sensing electrodes can be ignored. In other words, a disturbance to the first and second sensing electrodes resulting by the provision of the shield electrode can be prevented.

Furthermore, since the shield electrode extends toward the detecting surface beyond the first sensing electrode, the protrusion part of the shield electrode can provide directivity for detecting a human body.

In the aforementioned capacitive sensor, the shield electrode may extend beyond the first sensing electrode at one side of the first and the second sensing electrodes.

According to this capacitive sensor, since the shield electrode extends beyond the first sensing electrode at one side of the first and the second sensing electrodes, the sensitivity for detecting a human body decreases at the side where the shield electrode protrudes from the first sensing electrode. However, the sensitivity is maintained at the side where the shield electrode does not protrude from the first sensing electrode. In other words, it is possible to adjust the directivity for detecting a human body.

In the aforementioned capacitive sensor, the capacitive sensor may be fixed to an opening/closing member attached to a vehicle body in such a manner that the first and the second sensing electrodes extend in a direction transverse of the opening/closing portion, and the shield electrode may protrude from the first sensing electrode at one side closer to an outside of the vehicle body.

According to this capacitive sensor, the directivity for detecting a human body can be adjusted such that the sensitivity for detecting a human body positioned outside the vehicle body is decreased while maintaining the sensitivity for detecting a human body positioned inside the vehicle body. Therefore, this capacitive sensor can reliably detect a human body positioned inside the vehicle body while preventing disturbance due to a human body positioned outside the vehicle body.

In the aforementioned capacitive sensor, the capacitive sensor may be fixed to an opening/closing member attached to a vehicle body in such a manner that the first and the second sensing electrodes extend in a direction transverse of the opening/closing portion, and the shield electrode may protrude from the first sensing electrode at one side closer to an interior of the vehicle body.

According to this capacitive sensor, the directivity for detecting a human body can be adjusted such that the sensitivity for detecting a human body positioned inside the vehicle body is decreased while maintaining the sensitivity for detecting a human body positioned outside the vehicle body. Therefore, this capacitive sensor can reliably detect a human body positioned outside the vehicle body while preventing disturbance due to a human body positioned inside the vehicle body.

The aforementioned capacitive sensor can be adapted to an entrapment prevention apparatus. An entrapment prevention apparatus according to the present invention includes: an opening/closing member which is attached to a vehicle body and performs an opening/closing operation relative to the vehicle body; the aforementioned capacitive sensor which is fixed to the opening/closing member; a difference detection circuit which detects a difference value between electric potential of the first sensing electrode and electric potential of the second sensing electrode of the capacitive sensor; a signal processing circuit which outputs a detection signal when the difference value to be detected is equal to or greater than a predetermined threshold difference value; and a drive device which stops or reversely moves the opening/closing member based on the detection signal outputted while the opening/closing member is moving relative to the vehicle body.

According to this entrapment prevention apparatus, the difference detection circuit detects the difference value between the electric potential of the first sensing electrode and the electric potential of the second sensing electrode, and the signal processing circuit outputs the detection signal if the difference value to be detected is equal to or greater than the predetermined threshold difference value. If the difference value is equal to or greater than the predetermined threshold difference value, the signal processing circuit determines that a human body approaches the capacitive sensor and outputs the detection signal. The drive device then stops or reversely moves the opening/closing member based on the detection signal while the opening/closing member is moving relative to the vehicle body. Therefore, it is possible to prevent a human body from being caught or entrapped between the vehicle body and the opening/closing member. According to this entrapment prevention apparatus, while preventing an entrapment of a human body, it is also possible to prevent a disturbance caused by a water droplet sticking to the capacitive sensor as previously described. This entrapment prevention apparatus can prevent a detection error caused by the water droplet sticking to the periphery of the sensor.

It is a second aspect of the present invention to provide a capacitive sensor including: a pair of sensing electrodes which are spaced apart from each other; a shield electrode which is remote from and surrounds the sensing electrodes; and a coating member which holds the sensing electrodes and the shield electrode and which is made of an insulating material; wherein the coating member includes a mounting portion for attaching the capacitive sensor to a fixing member, and wherein the mounting portion is provided with a core member, and same electric potential is applied to the core member and the shield electrode.

According to this capacitive sensor, the electric potential of the core member provided in the mounting portion is the same as that of the shield electrode, which can improve the disturbance prevention effect. This enables the entrapment threshold value of the capacitive sensor to be set as small as possible, thereby improving the sensitivity for detecting an entrapment of a human body.

Further, since this capacitive sensor includes a mounting portion for attaching to the fixing member, the capacitive sensor can be fixed to the fixing member by press fitting the mounting portion relative to the fixing member. This can provide an easy mounting operation without requiring a mounting bracket and the like as well as decrease the number of assembling parts.

Further, the core member is preferably inserted into the mounting portion of the coating member so that when the coating member is deformed by receiving an external force, the core member prevents the mounting portion from being dropped off from the fixing member. Therefore, the strength of the mounting portion can be increased to firmly hold the capacitive sensor.

In the aforementioned capacitive sensor, the core member may be integral with the shield electrode.

According to this capacitive sensor, since the core member is integral with the shield electrode, the core member and the shield member can be formed as one part. This can decrease the number of assembling parts of the capacitive sensor and simplify the structure of the capacitive sensor, thereby improving the productivity.

In the aforementioned capacitive sensor, the shield electrode and the core member may be made of metal.

According to this capacitive sensor, since the shield electrode and the core member are made of metal and form a framework structure of the capacitive sensor, the holding power of the mounting portion relative to the fixing member can be improved to provide a firm mounting strength.

In the aforementioned capacitive sensor, the mounting portion may include a fitting groove for mounting the capacitive sensor to the fixing member, and the shield electrode may open at a detecting surface and the core member and the fitting groove may open at a side opposite to the detecting surface.

According to this capacitive sensor, since the core member and the fitting groove open at the opposite side of the detecting surface, the fitting groove opens toward the fixing member so that the capacitive sensor can be fixed to the fixing member by press fitting the fitting groove relative to the fixing member. Further, since the engagement part of the fixing member is fitted into the fitting groove, the sensor protrusion dimension that is the protrusion dimension of the capacitive sensor protruding from the fixing member can be decreased, providing a better appearance.

Other features and advantages of the present invention will be apparent from the following description.

BRIEF DESCRIPTION OF THE DRAWINGS

The aspects of the present invention will become more apparent by describing in detail illustrative, non-limiting embodiments thereof with reference to the accompanying drawings, in which:

FIG. 2 is a perspective view of a vehicle illustrating a part where the conventional capacitive sensor is fixed to a slide door;

FIG. 3 is an enlarged sectional view taken along the line X—X of FIG. 2;

FIGS. 8A and 8B are explanatory views of another embodiment illustrating the manner of attachment of the capacitive sensor to the slide door;

FIG. 13 explains a first verification, wherein (a) and (b) are schematic views of the capacitive sensor used for the first verification, and (c) is a circular graph illustrating the results of the first verification in which relation is shown between the direction angle (degree) of the human body relative to the capacitive sensor and the distance (mm) of the human body with respect to the capacitive sensor;

FIG. 18 explains a verification, wherein (a) is a schematic view of the capacitive sensor of FIG. 17 used for the verification, and (b) is a circular graph illustrating the results of the verification in which relation is shown between the direction angle (degree) of the human body relative to the capacitive sensor and the distance (mm) of the human body with respect to the capacitive sensor; and FIGS. 19A and 19B are cross sectional views of the capacitive sensor according to another embodiment of the present invention.

DETAILED DESCRIPTION OF THE INVENTION

With reference to the accompanying drawings, preferred embodiments of a capacitive sensor according to the present invention and an entrapment prevention apparatus using the capacitive sensor will be described below. In the following embodiments, the terms "front" and "rear" indicate the advance driving direction of the vehicle and the reverse driving direction of the vehicle, respectively.

Capacitive Sensor

Figure 4:
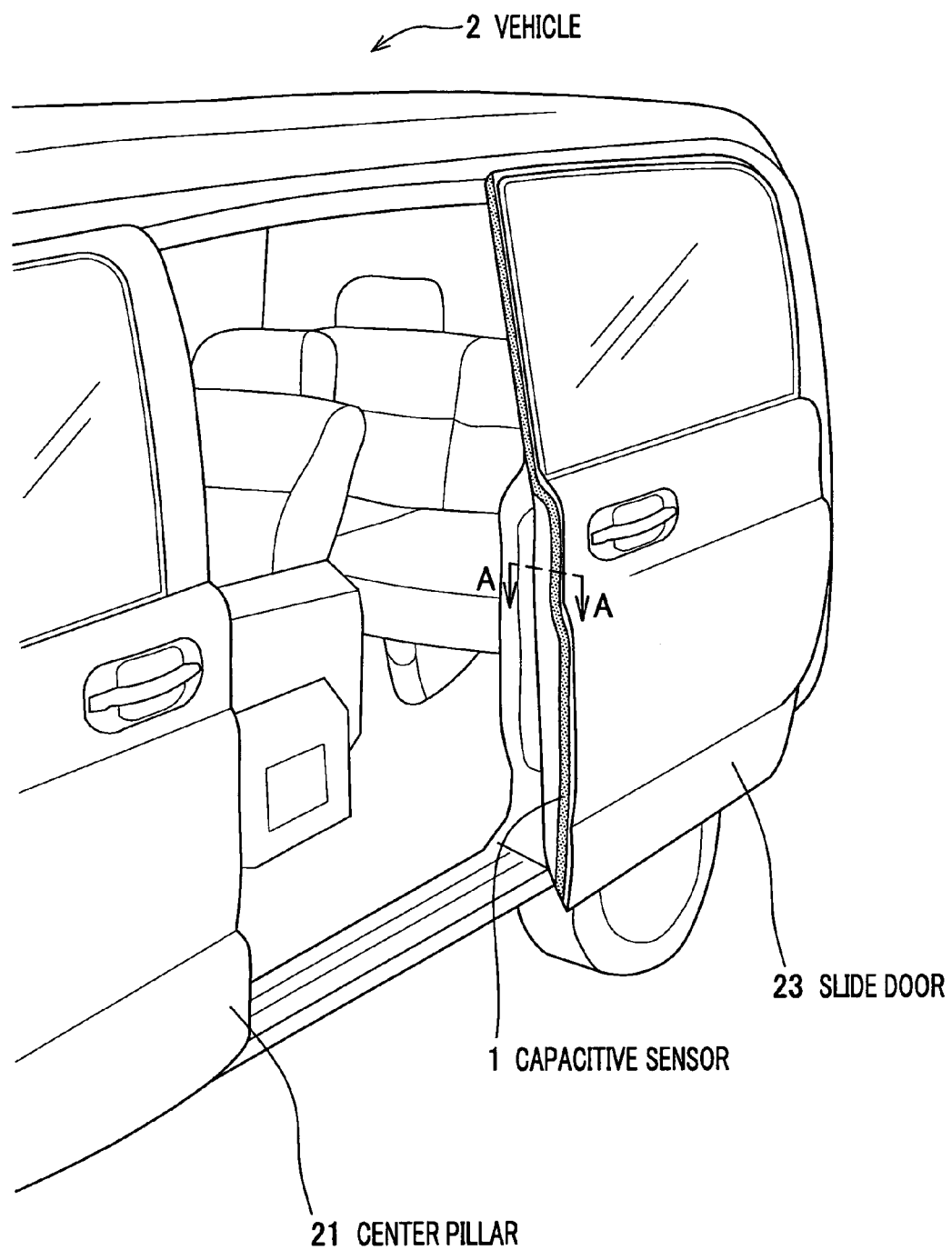
FIG. 4 is a perspective view of a vehicle illustrating a part where a capacitive sensor according to the present invention is attached to a power slide door of the vehicle.
Figure 5:
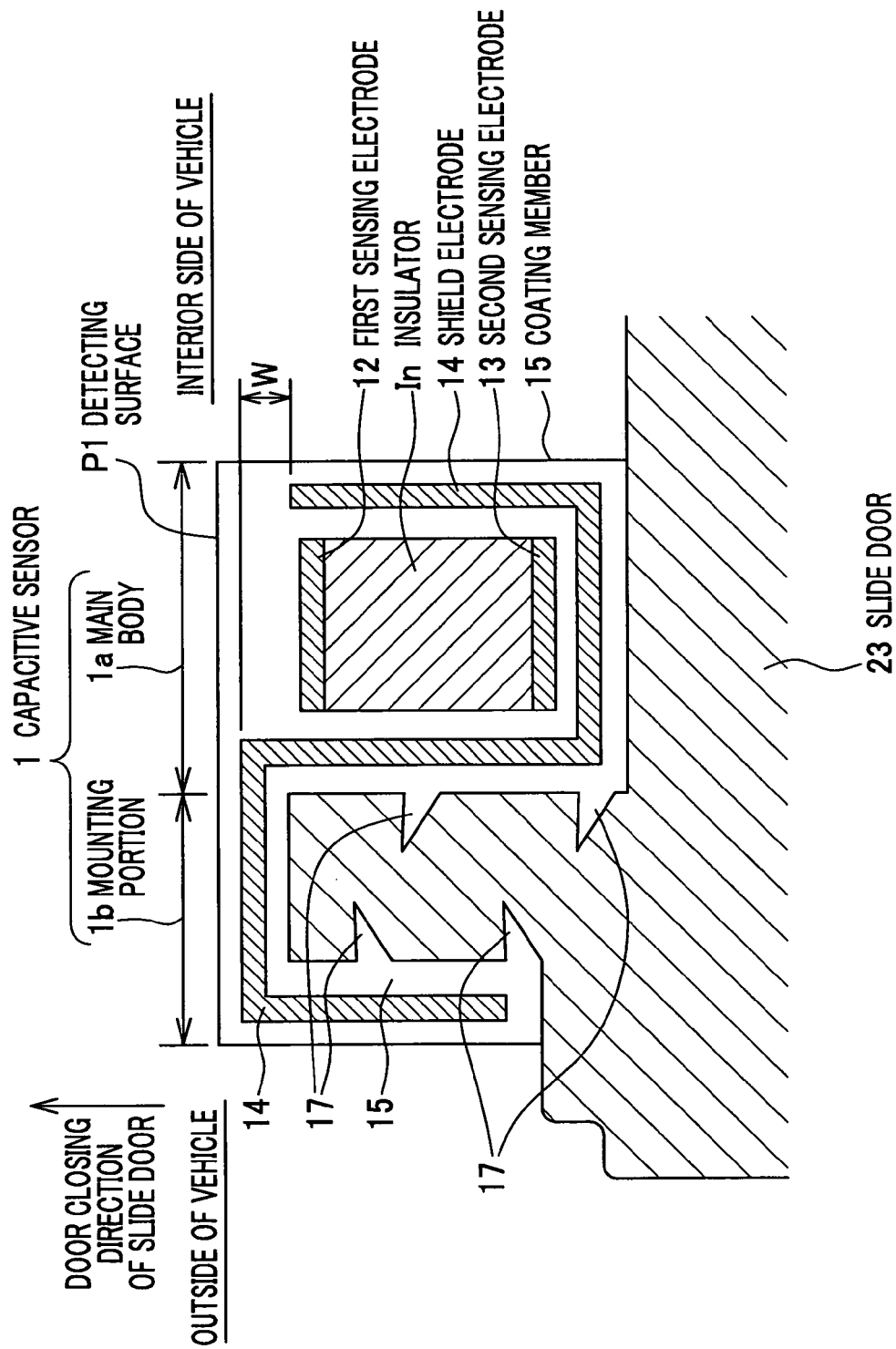
FIG. 5 is a sectional view taken along the line A—A of FIG. 4.

A capacitive sensor according to the present invention detects a human body (human body or the like) based on a difference value of electric potential between a pair of sensing electrodes. As shown in FIG. 4, the capacitive sensor 1 has an elongated profile. The capacitive sensor 1 is mounted to the vehicle 2 at the end surface of the slide door 23 facing to the center pillar 21 and extends from the top end to the bottom end of the slide door 23. As shown in FIG. 5, the capacitive sensor 1 includes a first sensing electrode 12, a second sensing electrode 13, a shield electrode 14, and a coating member 15 which covers the first sensing electrode 12, the second sensing electrode 13 and the shield electrode 14 and forms the outer profile of the capacitive sensor 1. The coating member 15 is made of an insulating material.

The slide door 23 corresponds to a fixing member defined in the claims.

As seen in FIG. 5, the capacitive sensor 1 mainly consists of a main body 1a and a mounting portion 1b. The mounting portion 1b is for mounting the main body 1a to the side door 23. Details of the mounting portion 1b will be described later.

With reference to FIG. 5, the first sensing electrode 12, the second sensing electrode 13 and the shield electrode 14 are arranged in the main body 1a. These first and second sensing electrodes 12, 13 and the shield electrode 14 are embedded in the coating member 15 and extend along the length of the coating member 15. In other words, these first and second sensing electrodes 12, 13 and the shield electrode 14 are positioned at the (front) end surface of the slide door 23 extending from the top end to the bottom end thereof.

The first sensing electrode 12 is arranged on a detecting surface P1 side of the capacitive sensor 1. The first sensing electrode 12 is formed of a conductive material in the shape of a strip having predetermined width and length. The first sensing electrode 12 is connected to a first reference capacitor 34a (FIG. 9) to be described later. As described later, when the first reference capacitor 34a is charged, a certain electric potential is set to the first sensing electrode 12. The conductive material which forms the first sensing electrode 12 may be metal, conductive rubber wherein metal powder as a filler is incorporated into rubber, conductive resin, etc.

The second sensing electrode 13 is formed of the strip-shaped conductive material having the same width and length as the first sensing electrode 12. The second sensing electrode 13 is arranged on the slide door 23 side of the capacitive sensor 1 opposite to the detecting surface P1 in such a manner that the first and second sensing electrodes 12, 13 are spaced apart and facing to each other. The second sensing electrode 13 and the first sending electrode 12 sandwiches an insulator In. The insulator In may be made of the same insulating material as the coating member 15. The insulator In may also be made of air.

The second sensing electrode 13 is connected to a second reference capacitor 34b (FIG. 9) to be described later. As described later, when the second reference capacitor 34b is charged, a certain electric potential is set to the second sensing electrode 13. In this preferred embodiment, when the first reference capacitor 34a and the second reference capacitor 34b are charged, the electric potential of the second sensing electrode 13 is equal to the electric potential of the first sensing electrode 12 as described later. The conductive material which forms the second sensing electrode 13 may be metal, conductive rubber wherein metal powder as a filler is incorporated into rubber, conductive resin, etc.

The shield electrode 14 is bent to have a substantially U-shaped cross section and is configured to partly expose the first and second sensing electrodes 12, 13 on the side of the detecting surface P1. In other words, the shield electrode 14 partly surrounds the first sensing electrode 12 and the second sensing electrode 13 within the main body 1a. To be more specific, the shield electrode 14 opens toward the detecting surface P1 and surrounds the first sensing electrode 12 and the second sensing electrode 13.

As viewed from the top, the shield electrode 14 is arranged to extend on both sides of the first and second sensing electrodes 12, 13, and protrudes at one side toward the detecting surface P1 beyond the first sensing electrode 12 and the other end of the shield electrode.

In this embodiment, the shield electrode 14 protrudes by the distance W at the flange portion (edge portion) 23a of the slide door 23 that is the outer side of the vehicle 2 than at the interior side of the vehicle 2, so that at the outer side of the vehicle the shield electrode 14 protrudes from the first sensing electrode 12 toward the detecting surface P1.

As described later, the shield electrode 14 prevents disturbance with respect to the first sensing electrode 12 and the second sensing electrode 13. The shield electrode 14 reliably prevents disturbance from the side where it protrudes.

The shield electrode 14 is connected to a charge supply circuit 35 (see FIG. 9) to be described later. The electric potential of the shield electrode 14 is set in the same as the electric potential of the first sensing electrode 12 and the second sensing electrode 13. The shield electrode 14 may be made of a conductive material such as metal, conductive rubber wherein metal powder as a filler is incorporated into rubber, and conductive resin.

The mounting portion 1b of the capacitive sensor 1 consists of the shield electrode 14 in the shape of a bent strip extending from the main body 1a, and the coating member 15 which covers the shield electrode 14.

The mounting portion 1b is bent along the flange portion 23a of the slide door 23 so that the flange portion 23a is sandwiched by the main body 1a and the mounting portion 1b. Namely, the mounting portion 1b holds the main body 1b relative to the flange portion 23a. The main body 1a is thereby mounted to the slide door 23, and the detecting surface P1 is set on the door closing side of the slide door 23.

Figure 7A:
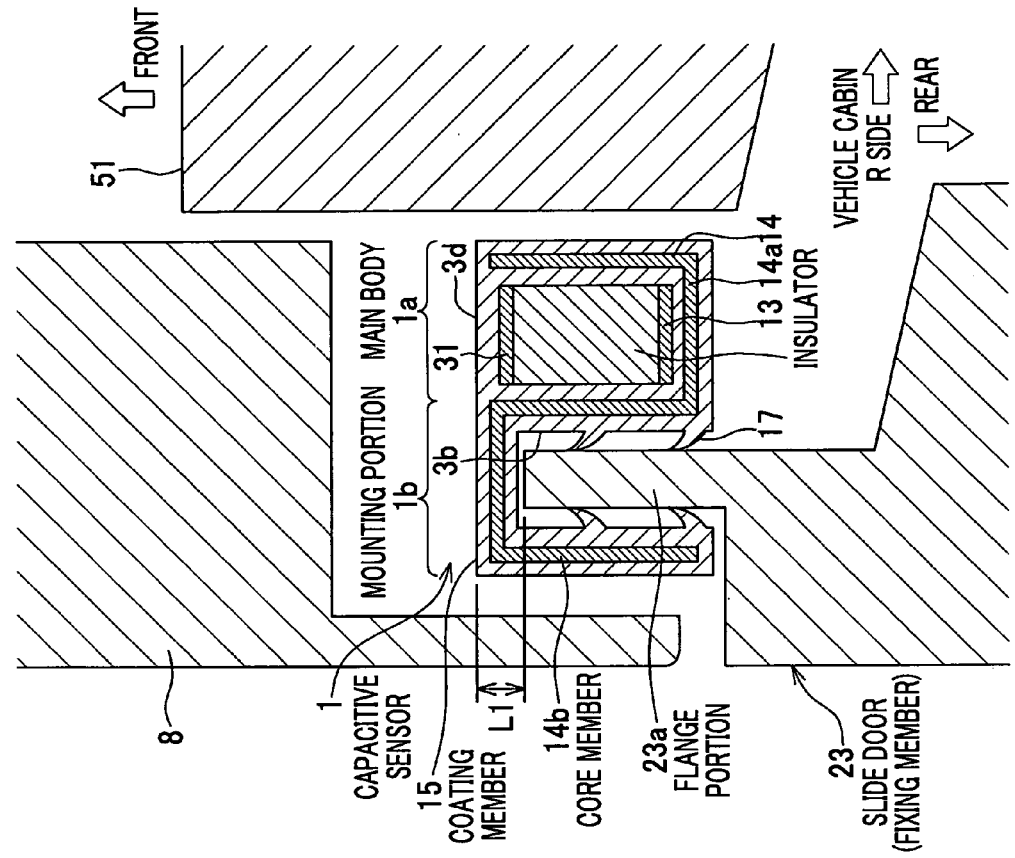
FIGS. 7A and 7B are explanatory views illustrating the manner of attachment of the capacitive sensor shown in FIG. 4 to the slide door.
Figure 7B:
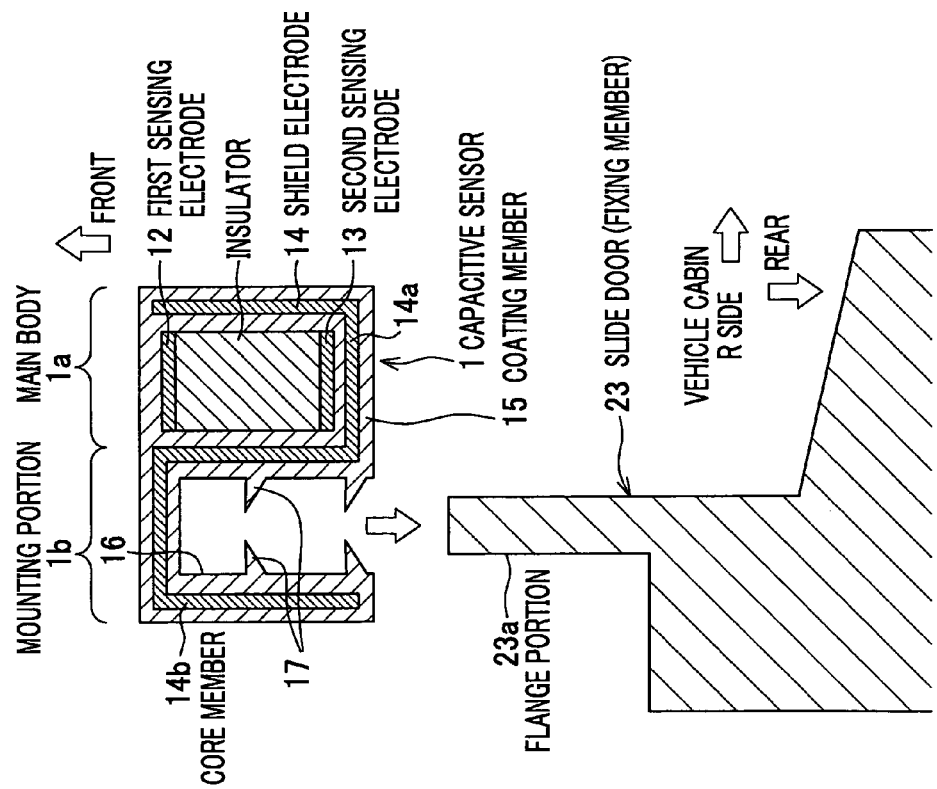

The coating member 15 is made of a hard insulating material, such as hard synthetic rubber and hard synthetic resin, to keep the shape of the capacitive sensor 1. As seen in FIGS. 7A and 7B, the coating member 15 opens to oppositely of the detecting surface of the main body 1a to provide a fitting groove 16 engageable with the flange portion 23a of the slide door 23. Provided on the inner walls of the fitting groove 16 (the inner wall positioned on the vehicle cabin R side and the inner wall positioned on the exterior side) are a plurality of engagement nails (projections) 17 formed as a so-called lip packing, so that when the mounting portion 1b is press fitted onto the flange portion 23a, the engagement nails 17 firmly hold the front and reverse surfaces of the flange portion 23a. The engagement nails 17 are formed as projection strips extending diagonally toward the innermost wall of the fitting groove 16, which can ease the press fitting operation onto the flange portion 23a while retaining a firm grip.

The coating member 15 may be formed by coinjection molding such that the engagement nails 17 are made of soft synthetic rubber or soft synthetic resin.

As shown in FIG. 7A and 7B, when the capacitive sensor 1 is mounted to the slide door 23, the fitting groove 16 of the mounting portion 1b is press-fitted onto the flange portion 23a that is formed on the front end portion of the slide door 23. The capacitive sensor 1 is then mounted to the flange portion 23a in such a manner that the fitting groove 16 covers the flange portion 23a as illustrated in FIG. 7B. Since the capacitive sensor 1 includes the fitting groove 16 used for mounting to the slide door 23, the capacitive sensor 1 can be fixed to the slide door 23 by only press fitting the fitting groove 16 onto the flange portion 23a. This can ease the mounting operation of the capacitive sensor 1.

The flange portion 23a is received in the capacitive sensor 1, and the sensor protrusion dimension L1 that is the protrusion dimension of the capacitive sensor 1 protruding from the flange portion 23a is as small as a few millimeters. Because of this small sensor protrusion dimension L1, the capacitive sensor 1 can provide a good appearance as well as decrease the possibility that a passenger contacts the capacitive sensor 1 while getting on and off the vehicle 2.

According to this capacitive sensor 1, a core member 14b of the shield electrode 14 is inserted into the mounting portion 1b, so that even if the mounting portion 1b receives an external force, the core member 14b prevents the mounting portion 1b and the fitting groove 16 from being deformed by the external force, thereby preventing the capacitive sensor 1 from being dropped off from the flange portion 23a. Providing the core member 14b can increase the strength of the mounting portion 1b and the fitting groove 16, so that the capacitive sensor 1 is reliably and firmly attached to the flange portion 23a.

Further, since the shield electrode 14 partly surrounds the first sensing electrode 12 and the second sensing electrode 13, it can decrease an external force applied to the first and second sensing electrodes 12, 13, thereby improving the durability against the external force. The shield electrode 14 is formed such that a main frame member 14a having a U-shaped profile and the core member 14b having a U-shaped profile are integral to form a framework structure of the coating member 15, thereby increasing the strength as well as preventing a deformation of the coating member 15.

Further, providing a plurality of engagement nails 17 inside the fitting groove 16 enables the engagement nails 17 to tightly hold the front and reverse surfaces of the flange portion 23a. Therefore, it is possible to firmly mount the capacitive sensor 1 to the flange portion 23a.

As shown in FIGS. 8A and 8B, the capacitive sensor 1 may be formed such that the U-shaped shield electrode 25 surrounding the first and second sensing electrodes 12, 13 and the insulator 15 within the main body 1a are separated from the U-shaped core member 26 positioned along the fitting groove 16 of the mounting portion 1b. Even if the shield electrode 25 and the core member 26 are separately embedded in the coating member 15, the manner of operation and the advantages of this capacitive sensor 1 are the same as the capacitive sensor 1 in which the main frame member 14a and the core member 14b are integrally formed.

According to the above capacitive sensors 1, the mounting portion 1b is mounted to the flange portion 23a of the slide door 23, and the main body 1a that is adjacent to the mounting portion 1b is positioned inward toward the vehicle cabin R side than the flange portion 23a so as to avoid water droplet such as rain.

Entrapment Prevention Apparatus

An entrapment prevention apparatus using the above capacitive sensor 1 will be described below. The entrapment prevention apparatus according to the present invention prevents bumping of the slide door 23 against a human body or an entrapment of a human body between the slide door 23 and the center pillar 21 of the vehicle body 24 (see FIG. 6) when the slide door 23 (FIG. 4) of the vehicle 2 is closed. The term "slide door" corresponds to the opening/closing member defined in the claims.

Figure 6:
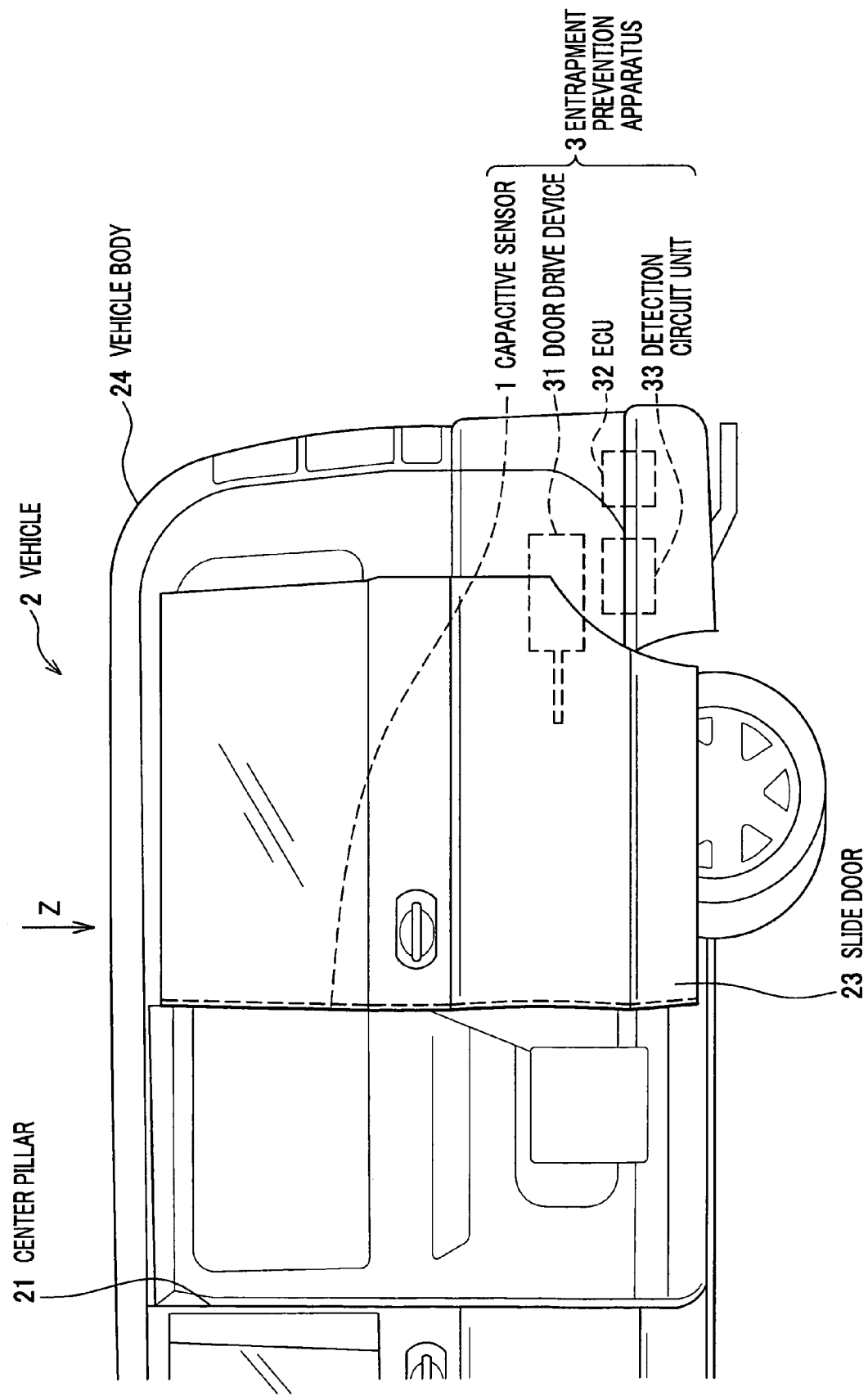
FIG. 6 is a schematic view of an entrapment prevention apparatus, into which the capacitive sensor according to the present invention is incorporated.

As shown in FIG. 6, the entrapment prevention apparatus 3 includes the capacitive sensor 1, a door drive device 31, an ECU (Electronic Control Circuit) 32, and a detection circuit unit 33. The door drive device 31, the ECU 32 and the detection circuit unit 33 are arranged in the vehicle body 24 of the vehicle 2. The door drive device 31 corresponds to the drive device defined in the claims.

The door drive device 31 is a known device for opening and closing the slide door 23 based on a command signal outputted from the ECU 32. The door drive device 31 consists of an electric motor (not shown) rotating either in the forward direction or the reverse direction or stopping the rotation in response to the command signal outputted by the ECU 32, and a push-pull mechanism (not shown) for pushing and pulling the slide door 23 by utilizing the rotating force produced by the electric motor. The door drive device 31 detects whether the slide door 23 is fully opened, and outputs a full open detection signal to a signal processing circuit 37 to be described later (see FIG. 9) of the detection circuit unit 33. The door drive device 31 also detects whether the slide door 23 is fully closed, and outputs a close detection signal to the signal processing circuit 37 (FIG. 9) of the detection circuit unit 33. When the full open detection signal or the close detection signal is inputted to the signal processing circuit 37, as shown in FIG. 9, the signal processing circuit 37 outputs a command signal to the charge supply circuit 35 such that the charge supply circuit 35 of the detection circuit unit 33 either supplies the reference quantity of electricity to the first and second reference capacitors 34a, 34b or discharges the charged electricity.

Based on a detection signal indicating a detection of a human body and outputted by the detection circuit unit 33, the ECU 32 outputs a control signal to the door drive device 31 such that the electric motor (not shown) of the door drive device 31 rotates either in the forward direction or the reverse direction or stops its rotation.

Figure 9:
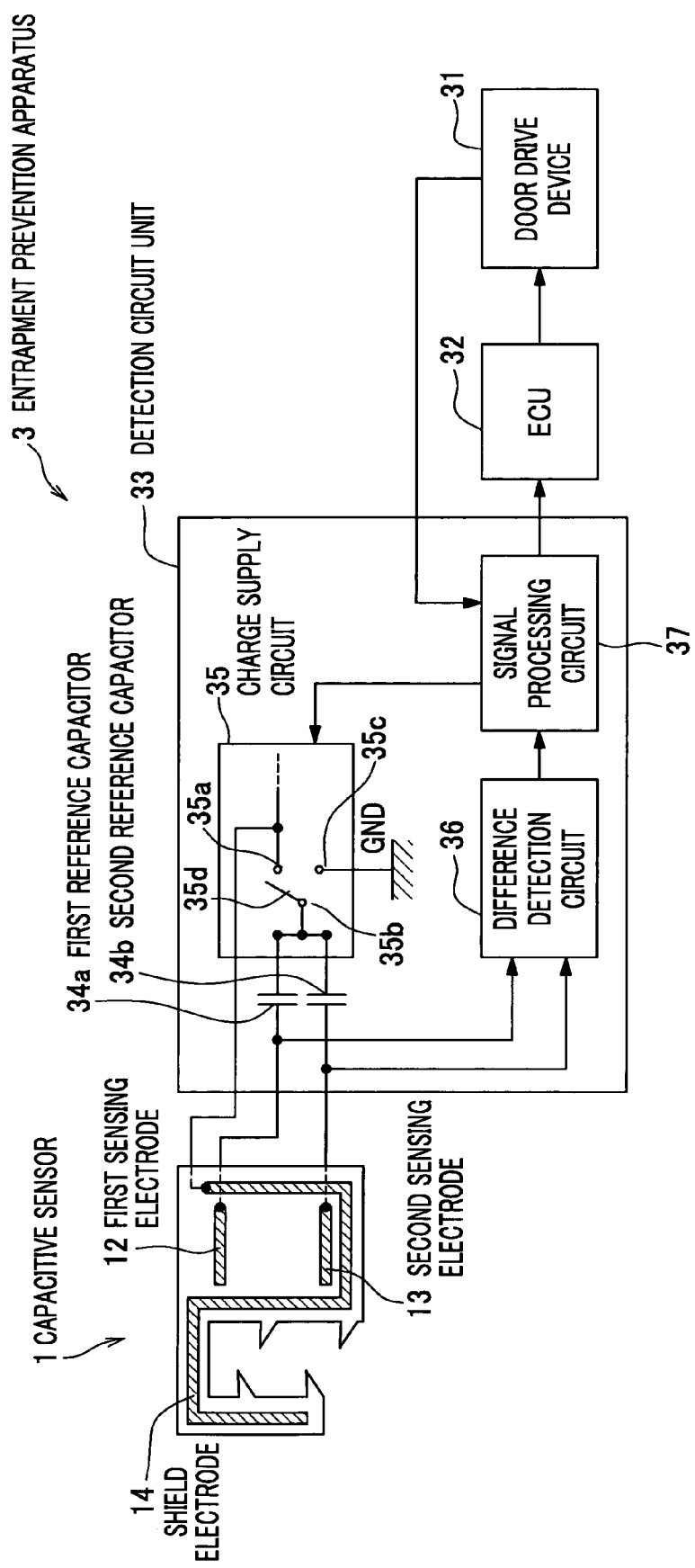
FIG. 9 is a block diagram of the entrapment prevention apparatus shown in FIG. 6.

As seen in FIG. 9, the detection circuit unit 33 includes the first reference capacitor 34a, the second reference capacitor 34b, the charge supply circuit 35, the difference detection circuit 36, and the signal processing circuit 37.

The first reference capacitor 34a is connected to the first sensing electrode 12 of the capacitive sensor 1, and the second reference capacitor 34b is connected to the second sensing electrode 13 of the capacitive sensor 1. The charge supply circuit 35 to be described later supplies electric charge to the first reference capacitor 34a and the second reference capacitor 34b, respectively, so that the reference quantity of electricity is stored in the first reference capacitor 34a and the second reference capacitors 34b. In this exemplary embodiment, the first reference capacitor 34a and the second reference capacitor 34b have the same electric capacity.

The charge supply circuit 35 consists of an electric potential setting terminal 35a that is set in the reference electric potential, an input terminal 35b for the first and second reference capacitors 34a, 34b, a ground potential terminal 35c, and a switch 35d for connecting the input terminal 35b to the electric potential setting terminal 35a or to the ground potential terminal 35c based on the command signal outputted from the signal processing circuit 37.

The electric potential setting terminal 35a is set in the reference electric potential, for example, of 1.3 V. The shield electrode 14 is connected to the electric potential setting terminal 35a, so that the reference electric potential is applied to the shield electrode 14.

The switch 35d connects the input terminal 35b and the electric potential setting terminal 35a when the signal processing circuit 37 outputs the command signal based on the full open detection signal from the door drive device 31. By this connection of the switch 35d, the reference quantity of electricity is charged in the first and second reference capacitors 34a, 34b, and thereafter the switch 35d disconnects the connection between the input terminal 35b and the electric potential setting terminal 35a to retain the reference quantity of electricity. The switch 35d prevents a variance of the reference quantity of electricity that is caused by a change in the electrostatic capacity of the first and second reference capacitors 34a, 34b to be described later. When the reference quantity of electricity is charged in the first reference capacitor 34a and the second reference capacitor 34b, the electric potential of the first reference capacitor 34a, the electric potential of the second reference capacitor 34b, and the electric potential of the shield electrode 14 become equal to each other. When the signal processing circuit 37 outputs the command signal based on the close detection signal from the door drive device 31, the switch 35d then connects the input terminal 35b and the ground potential terminal 35c so that the quantity of electricity charged in the first and second reference capacitors 34a, 34b is discharged to the earth.

The difference detection circuit 36 is connected to the first sensing electrode 12 and the second sensing electrode 13. The difference detection circuit 36 detects the electric potential of the first sensing electrode 12 and the electric potential of the second sensing electrode 13, and determines the difference value between the electric potential of the first sensing electrode 12 and the electric potential of the second sensing electrode 13. The difference detection circuit 36 then outputs a difference detection signal to the signal processing circuit 37. For example, a known circuit including a differential amplifier may be used for the difference detection circuit 36.

The signal processing circuit 37 receives the difference detection signal from the difference detection circuit 36, and compares the difference value based on the difference detection signal with a predetermined threshold difference value. If the difference value based on the difference detection signal is equal to or greater than the threshold value, the signal processing circuit 37 outputs the detection signal indicating a detection of a human body to the ECU 32. The detection signal indicating a detection of a human body corresponds to the detection signal defined in the claims.

When the signal processing circuit 37 receives the full open detection signal from the door drive device 31, it outputs the command signal to the charge supply circuit 35 (switch 35d) such that the charge supply circuit 35 supplies the reference quantity of electricity to the first reference capacitor 34a and the second reference capacitor 34b.

When the signal processing circuit 37 receives the close detection signal from the door drive device 31, it outputs the command signal to the charge supply circuit 35 (switch 35d) such that the charge supply circuit 35 discharges the quantity of electricity charged in the first reference capacitor 34a and the second reference capacitor 34b.

The signal processing circuit 37 may be formed, for example, by CPU (Central Processing Unit) and a memory for storing the threshold difference value.

Operations of the capacitive sensor 1 and the entrapment prevention apparatus 3 will be described below with reference to the drawings.

Figure 10A:
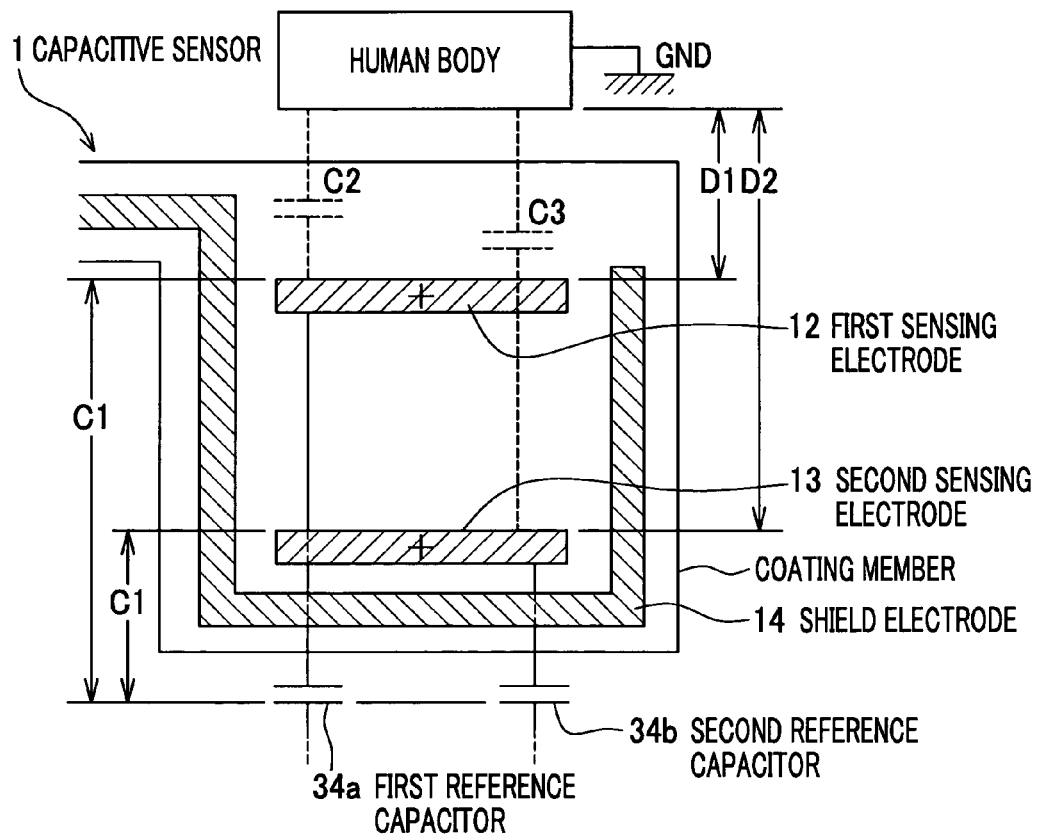
FIG. 10A is a schematic view explaining the operations of the first and second sensing electrodes when a human body approaches the capacitive sensor.

As shown in FIG. 10A, the first sensing electrode 12 is connected to the first reference capacitor 34a, and therefore the electrostatic capacity between the first sensing electrode 12 and the first reference capacitor 34a is equal to the electrostatic capacity of the first reference capacitor 34a. Also, the second sensing electrode 13 is connected to the second reference capacitor 34b, and therefore the electrostatic capacity between the second sensing electrode 13 and the second reference-capacitor 34b is equal to the electrostatic capacity of the second reference capacitor 34b. According to this preferred embodiment, since the first reference capacitor 34a and the second reference capacitor 34b have the same electrostatic capacity, the electrostatic capacity between the first sensing electrode 12 and the first reference capacitor 34a is equal to the electrostatic capacity between the second sensing electrode 13 and the second reference capacitor 34b. This electrostatic capacity is denoted by C1 in FIG. 10A. It should be noted that the electrode area of the first sensing electrode 12 is equal to the electrode area of the second sensing electrode 13.

As seen in FIGS. 6 and 9, when the slide door 23 is fully opened and the door drive device 31 outputs the full open detection signal to the signal processing circuit 37 of the detection circuit unit 33, the signal processing circuit 37 outputs the command signal that is based on the full open detection signal to the charge supply circuit 35. When the charge supply circuit 35 receives the command signal, it establishes the connection between the input terminal 35b and the electric potential setting terminal 35a by the switch 35d. The charge supply circuit 35 then supplies the reference quantity of electricity to the first reference capacitor 34a and the second reference capacitor 34b, respectively. When the first reference capacitor 34a and the second reference capacitor 34b are charged with the reference quantity of electricity, the switch disconnects the connection between the input terminal 35b and the electric potential setting terminal 35a. In this state, the electric potential of the first sensing electrode 12 connected to the first reference capacitor 34a is equal to the electric potential of the second sensing electrode 13 connected to the second reference capacitor 34b. Further, the electric potential of the shield electrode 14 connected to the electric potential setting terminal 35a is equal to the electric potential of the first and second sensing electrodes 12, 13. Herein, the reference quantity of electricity is indicated by Q, and the electric potential of the first sensing electrode 12, the electric potential of the second sensing electrode 13 and the electric potential of the shield electrode 14 are indicated by V.

If a human body does not exist in the detectable region of the capacitive sensor 1, the electric potential of the first sensing electrode 12 and the electric potential of the second sensing electrode 13 that are outputted to the difference detection circuit 36 are given by the following equation (5).

$$V = Q/C1 \tag{5}$$

where Q indicates the quantity of electricity stored in the first reference capacitor 34a and the second reference capacitor 34b, respectively, and C1 indicates the electrostatic capacity between the first sensing electrode 12 and the first reference capacitor 34a and the electrostatic capacity between the second sensing electrode 13 and the second reference capacitor 34b.

In this instance, the difference detection circuit 36 outputs to the signal processing circuit 37 the difference detection signal indicating that the difference value between the electric potential of the first sensing electrode 12 and the electric potential of these condensing electrode 13 is zero. When the signal processing circuit 37 receives this difference detection signal, it compares the difference value based on the difference detection signal with the predetermined threshold difference value and determines that the difference value is lower than the threshold value. Therefore, the signal processing circuit 37 does not output the detection signal indicating a detection of a human body to the ECU 32.

Next, if a human body exists in the detectable region of the capacitive sensor 1, as shown in FIG. 10A, the electrostatic capacity C2 is induced between the earthed human body and the first sensing electrode 12. Between the human body and the second sensing electrode 13 is also induced the electrostatic capacity C3. In this instance, if the distance between the human body and the first sensing electrode 12 is D1 and the distance between the human body and the second sensing electrode 13 is D2, the electrostatic capacity C2 and the electrostatic capacity C3 are respectively given by the following equations (6) and (7).

$$C2 = \epsilon \cdot S/D1 \tag{6}$$

where, in equation (6), $\epsilon$ indicates the dielectric constant of air, and S indicates the electrode area of the first sensing electrode 12.

$$C3 = \epsilon \cdot S/D2 \tag{7}$$

where, in equation (7), $\in$ indicates the dielectric constant of air, and S indicates the electrode area of the second sensing electrode 13. As described previously, the electrode area of the first sensing electrode 12 is equal to the electrode area of the second sensing electrode 13.

To be more specific, since the electrode area S of the first sensing electrode 12 is equal to the electrode area S of the second sensing electrode 13, the electrostatic capacity C2 is inversely proportional to the distance D1 between the human body and the first sensing electrode 12 and the electrostatic capacity C3 is inversely proportional to the distance D2 between the human body and the second sensing electrode 13.

When the electrostatic capacity C2 and the electrostatic capacity C3 are induced, the electric potential V1 of the first sensing electrode 12 and the electric potential V2 of the second sensing electrode 13 that are outputted to the difference detection circuit 36 are respectively given by the following equations (8) and (9).

$$V1 = Q/(C1+C2) \quad (8)$$

where, in equation (8), Q and C1 are the same as the above, and C2 indicates the electrostatic capacity induced between the human body and the first sensing electrode 12.

$$V2 = Q/(C1+C3) \quad (9)$$

where, in equation (9), Q and C1 are the same as the above, and C3 indicates the electrostatic capacity induced between the human body and the second sensing electrode 13.

In this instance, the difference detection circuit 36 detects the difference value between the electric potential of the first sensing electrode 12 and the electric potential of the second sensing electrode 13, that is, the difference value $\Delta V$ given by the following equation (10).

$$\Delta V = V1 - V2 = \{Q/(C1+C2)\} - \{Q/(C1+C3)\} \quad (10)$$

where, in equation (10), V1, V2, Q, C1, C2 and C3 are the same as the above.

If the equation (6) and the equation (7) are substituted into the equation (10), the following equation (11) is given.

$$\Delta V = \{Q/(C1+\in \cdot S/D1)\} - \{Q/(C1+\in \cdot S/D2)\} \quad (11)$$

Herein, since the distance D1 between the human body and the first sensing electrode 12 is smaller than the distance D2 between the human body and the second sensing electrode 13 (D1<D2), the difference value $\Delta V$ in the equation (11) takes a positive number ($\Delta V > 0$).

In this instance, the difference detection circuit 36 outputs to the signal processing circuit 37 the difference detection signal indicating that the difference value $\Delta V$ is $\Delta V > 0$. When the signal processing circuit 37 receives this difference detection signal, it compares the difference value based on the difference detection signal with the predetermined threshold difference value. If the threshold difference value (indicated by Th in the following expression) is previously set in the range of $0 < Th \leq \Delta V$, the signal processing circuit 37 determines that the difference value $\Delta V$ is equal to or greater than the threshold difference value. Based on this determination, the signal processing circuit 37 then outputs the detection signal indicating a detection of a human body to the ECU 32. The capacitive sensor 1 can thus detect a human body.

Figure 1A:
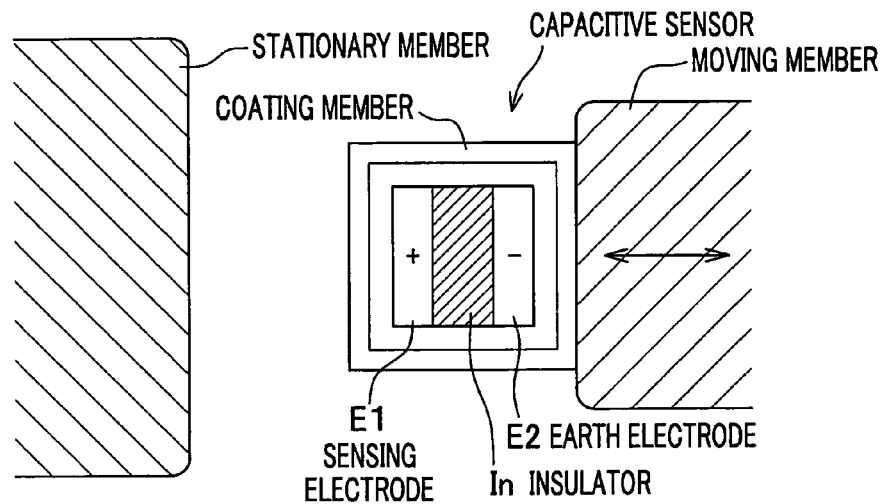
FIGS. 1A, 1B and 1C are explanatory views illustrating a conventional capacitive sensor.
Figure 1B:
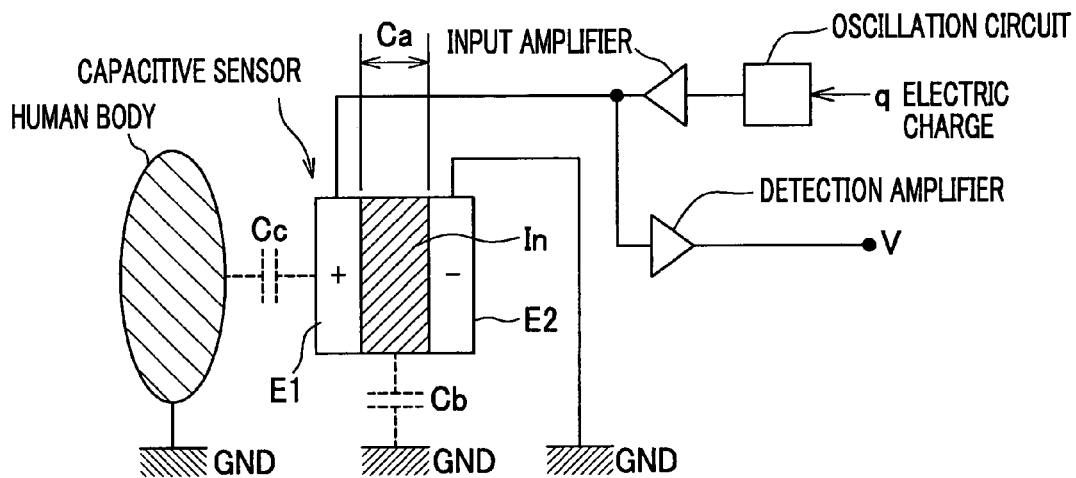
Figure 1C:
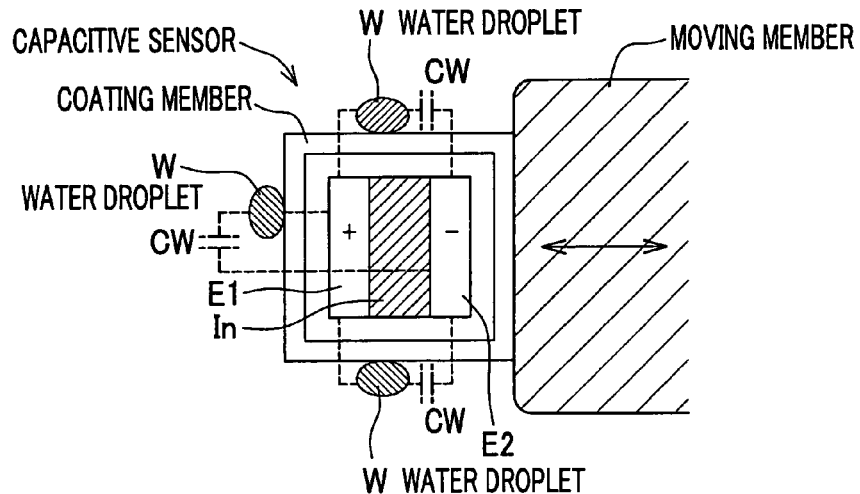
Figure 10B:
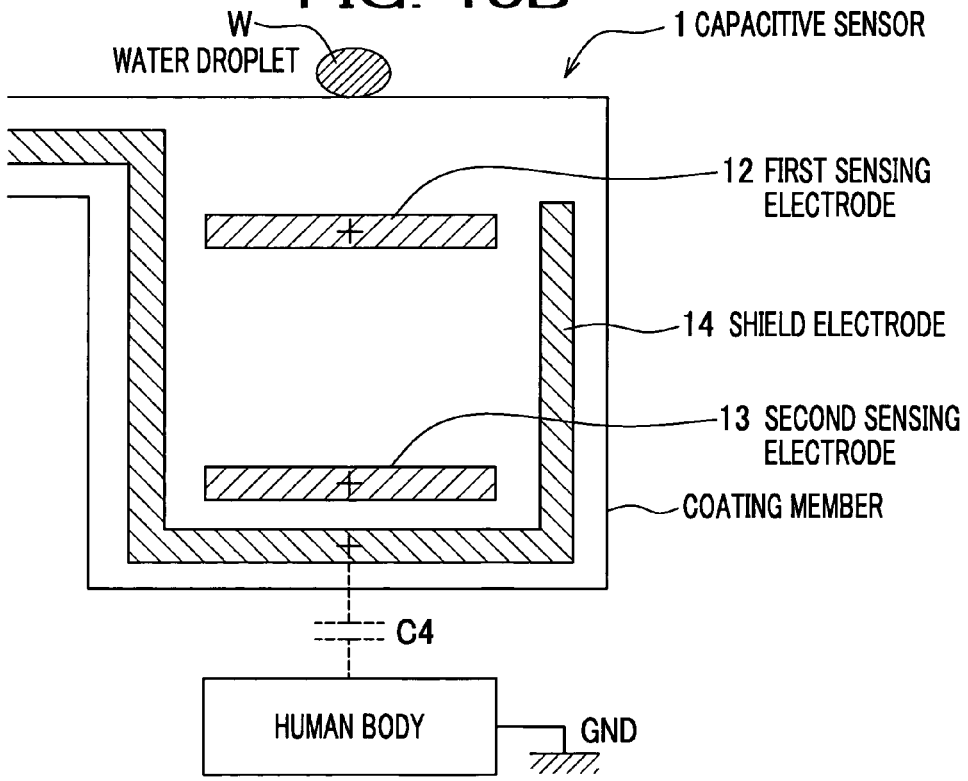
FIG. 10B is a schematic view explaining the operations of the first and second sensing electrodes when a water droplet sticks to the capacitive sensor as well as the operation of the shield electrode when a human body approaches the capacitive sensor from the shield electrode side.

As shown in FIG. 10B, since the capacitive sensor 1 does not include an earth electrode E2 (see FIG. 1A) as with the conventional capacitive sensor, the distance between the water droplet W and the earth is long. As the result, the electrostatic capacity of the capacitive sensor 1 changes very little even if a water droplet sticks to the capacitive sensor 1. Therefore, the capacitive sensor 1 prevents a detection error caused by the water droplet W sticking to the periphery of the sensor.

The capacitive sensor 1 detects a human body by detecting the difference value between the electric potential of the first sensing electrode 12 and the electric potential of the second sensing electrode 13. Therefore, a change in the electric potential of the first sensing electrode 12 and a change in the electric potential of the second sensing electrode 13, which are caused by the water droplet W sticking to the sensor 1, can be compensated to each other by the determination of the difference value. The capacitive sensor 1 can thus prevent a detection error caused by the water droplet W sticking to the periphery of the sensor.

As previously described, the capacitive sensor 1 includes the shield electrode 14 (FIG. 5), and the electric potential same as that of the first and second sensing electrodes 12, 13 is applied to the shield electrode 14 by the charge supply circuit 35 (see FIG. 9).

According to the capacitive sensor 1, as shown in FIG. 10B, when a human body approaches the capacitive sensor 1 from the shield electrode 14 side, the electrostatic capacity C4 is induced between the shield electrode 14 and the human body. However, electrostatic capacity is not induced between the first and second sensing electrodes 12, 13 and the human body. In other words, even if a human body approaches the capacitive sensor 1 from the reverse side, it is possible to prevent a detection error of the capacitive sensor 1 as if a human body is detected on the detecting surface P1 side, that is, at the door closing side of the slide door 23.

Further, since the electric potential of the shield electrode 14 is equal to the electric potential of the first and second sensing electrodes 12, 13, the electrostatic capacity between the shield electrode 14 and the first and second sensing electrodes 12, 13 can be ignored. In other words, a disturbance to the first and second sensing electrodes 12, 13 resulting by the provision of the shield electrode 14 can be prevented.

Figure 11:
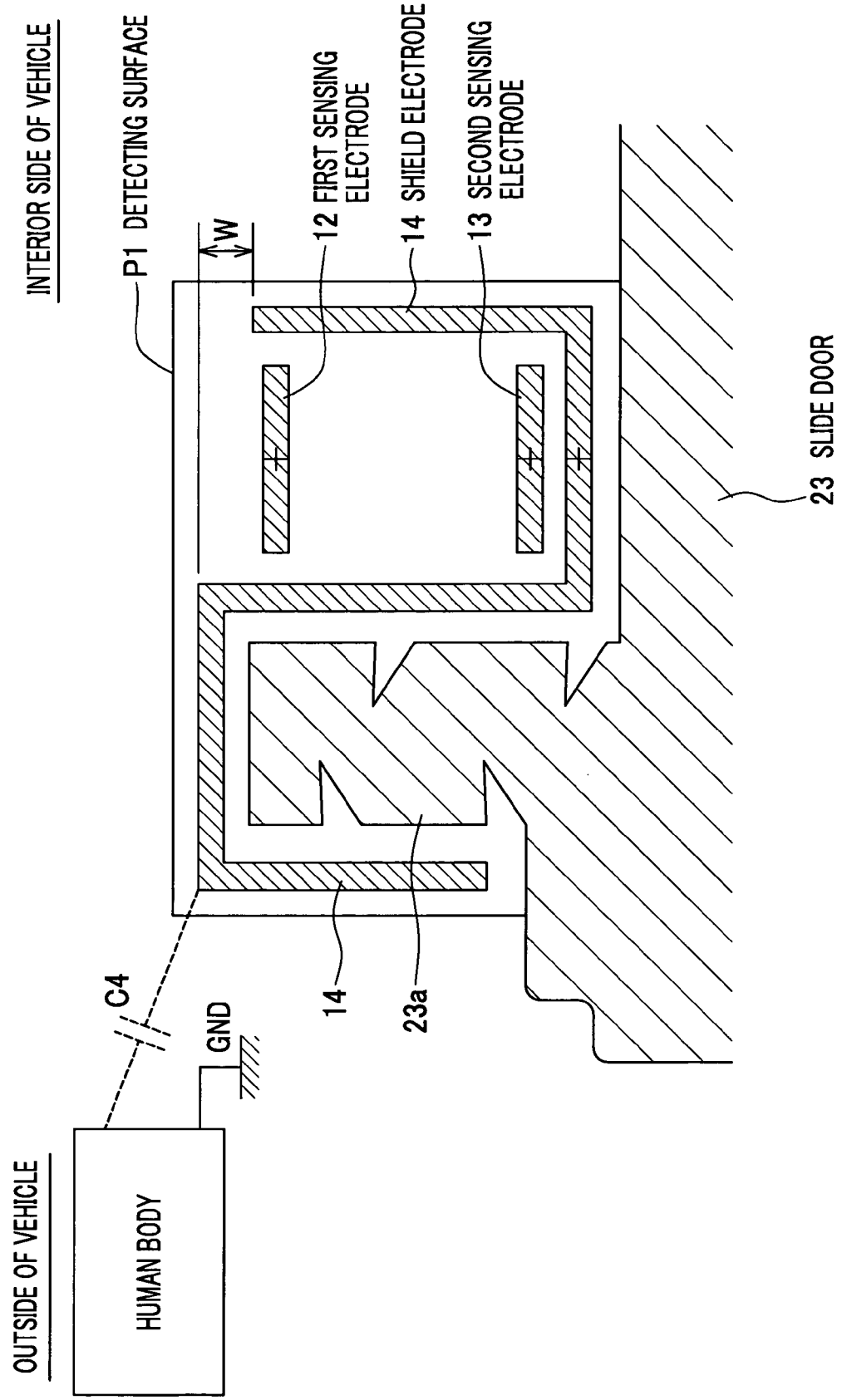
FIG. 11 is a schematic view explaining the operation of the shield electrode when a human body approaches the capacitive sensor from the outside of the vehicle body.

Further, as shown in FIG. 11, the shield electrode 23 extends beyond the first sensing electrode 12 by the distance W at the flange portion 23a of the slide door 23. In other words, the shield electrode 14 protrudes by the distance W at one side closer to the outer side of the vehicle 2 (FIG. 4) than at the other side closer to the interior side of the vehicle 2. Therefore, when a human body approaches to the capacitive sensor 1 from the outside of the vehicle 2, the electrostatic capacity C4 is induced between the shield electrode 14 and the human body. However, electrostatic capacity is not induced between the first and second sensing electrodes 12, 13 and the human body. The capacitive sensor 1 can reliably detect a human body that exists in the position where the human body would be caught or entrapped by the slide door 23, with a certain directivity and without detecting everything including a human body that exists around the slide door 23. At the other side of the shield electrode 14 where the distance is short by W, the sensitivity for detecting a human body (not shown) that exists inside the vehicle 2 can be increased.

Figure 12:
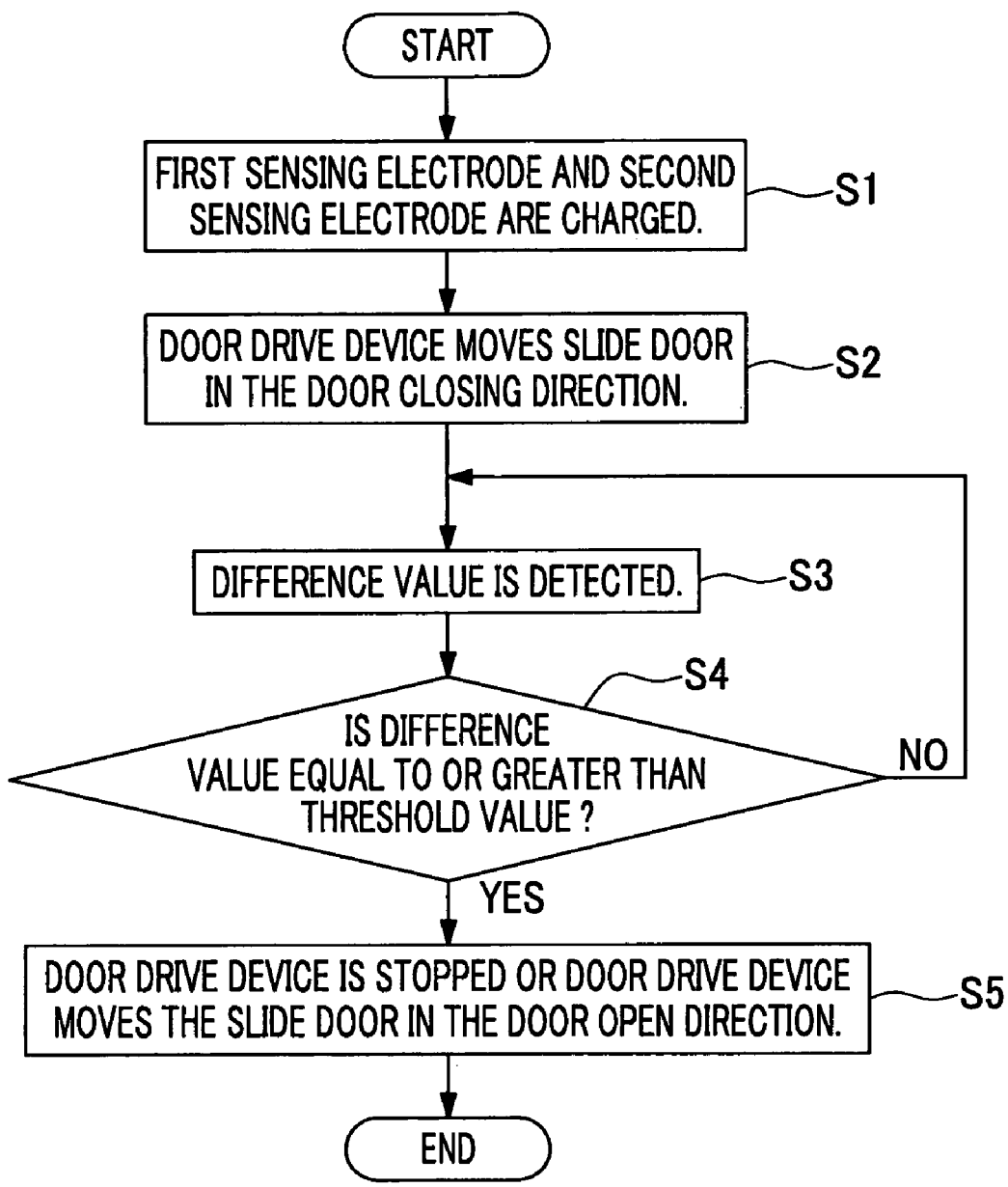
FIG. 12 is a flow chart illustrating the operation of the entrapment prevention apparatus.

Operation of the entrapment prevention apparatus 3 including the above capacitive sensor 1 will be described. As shown in FIG. 9, when the slide door 23 (FIG. 4) is fully opened, the door drive device 31 outputs the full open detection signal to the signal processing circuit 37. When the signal processing circuit 37 receives the full open detection signal, it outputs the command signal to the charge supply circuit 35. As shown in FIG. 12, the charge supply circuit 35 supplies the reference quantity of electricity to the first sensing electrode 12 and the second sensing electrode 13 based on this command signal (step S1).

Meanwhile, when an operator of the entrapment prevention apparatus 3 turns on the door switch (not shown) of the slide door 23, the door drive device 31 moves the slide door 23 in the door closing direction (step S2). The difference detection circuit 36 then starts to detect the difference value between the electric potential of the first sensing electrode 12 and the electric potential of the second sensing electrode 13 (step S3) and outputs the difference detection signal to the signal processing circuit 37.

When the signal processing circuit 37 receives the difference detection signal, it determines whether the difference value is equal to or greater than the predetermined threshold difference value based on the difference detection signal (step S4). If the difference value is smaller than the threshold value (NO in step S4), the signal processing circuit 37 determines that a human body does not exist in the region between the slide door 23 and the center pillar 21. Therefore, the signal processing circuit 37 does not output the detection signal indicating a detection of a human body. In the mean time, the difference detection circuit 36 continuously detects the difference value (step S3). When doing so, the slide door 23 is moving in the door closing direction.

If the difference value based on the difference detection signal is equal to or greater than the threshold value (YES in step S4), the signal processing circuit 37 outputs the detection signal indicating a detection of a human body to the ECU 32. When the ECU 32 receives the detection signal, it outputs the command signal to the door drive device 31 such that the door drive device 31 stops or moves the slide door in the door opening direction. When the door drive device 31 receives the command signal, it stops the slide door 23 or moves the slide door 23 in the door opening direction (step S5). Therefore, it is possible to prevent bumping of the slide door 23 against a human body or an entrapment of a human body between the slide door 23 and the center pillar 21. In the case where the slide door 23 is closed without the capacitive sensor 1 detecting a human body, the door drive device 31 outputs the close detection signal to the signal processing circuit 37. When the signal processing circuit 37 receives the close detection signal, it outputs the command signal to the charge supply circuit 35. The charge supply circuit 35 then discharges the electricity charged in the first and second sensing electrodes 12, 13 based on this command signal.

Figure 14:
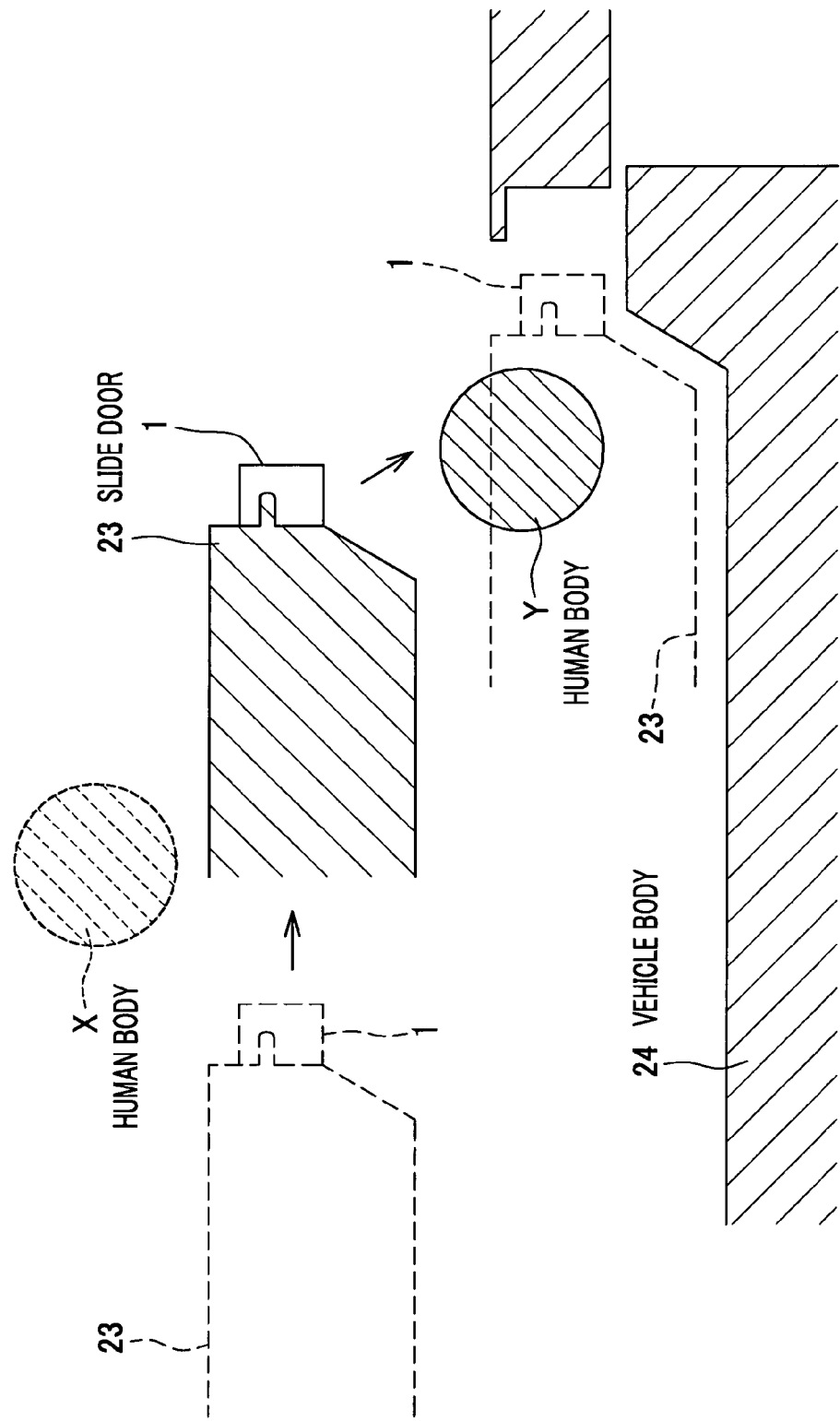
FIG. 14 is a schematic view explaining the movement of the slide door when the slide door is closed.
Figure 15:
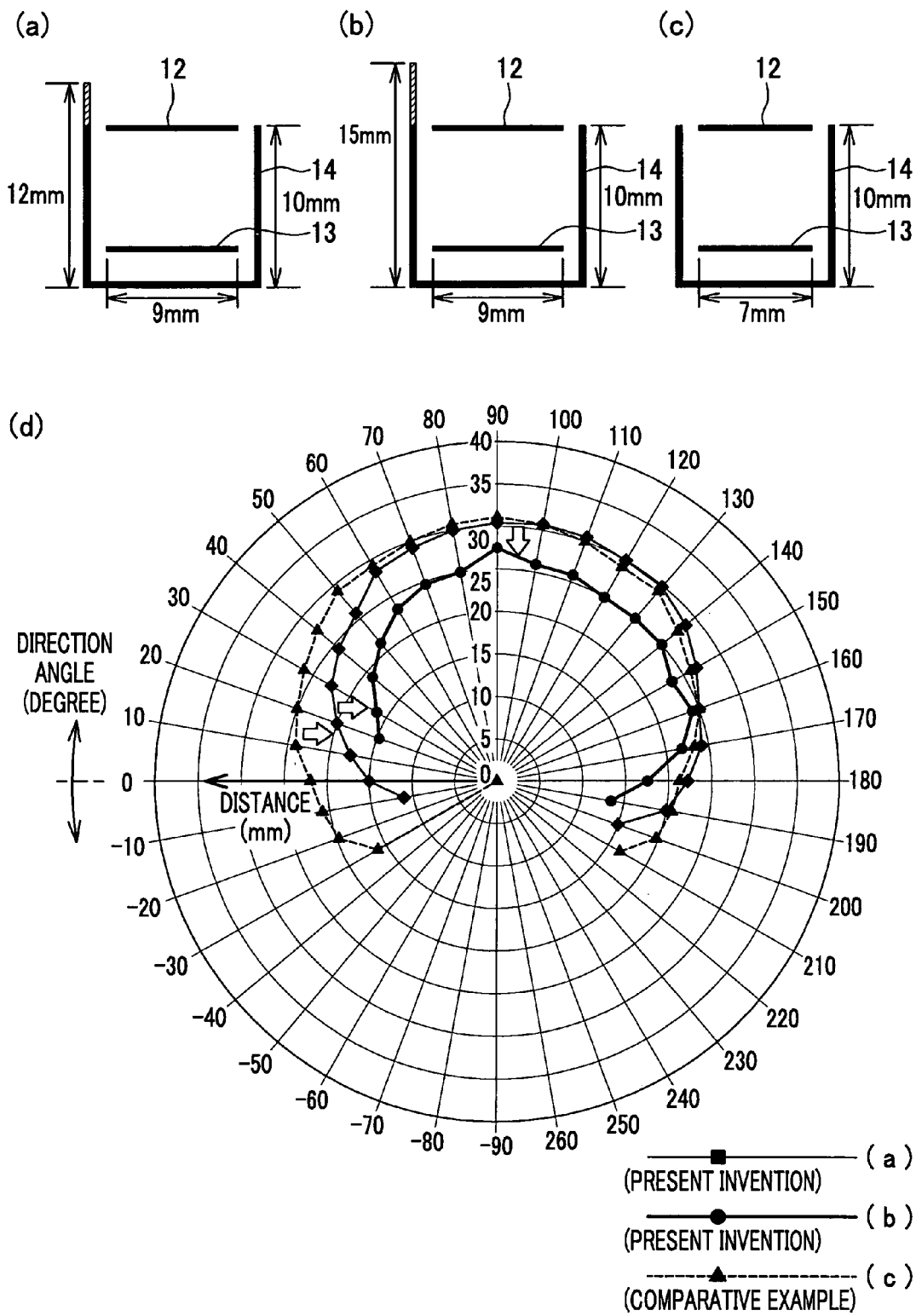
FIG. 15 explains a second verification, wherein (a), (b) and (c) are schematic views of the capacitive sensor used for the second verification, and (d) is a circular graph illustrating the results of the second verification in which relation is shown between the direction angle (degree) of the human body relative to the capacitive sensor and the distance (mm) of the human body with respect to the capacitive sensor.

Verifications were made to verify the detectable region of the capacitive sensor 1. With reference to FIGS. 13 to 15, the results of the verifications will be described below.

First Verification

A capacitive sensor having the same construction as the capacitive sensor 1 shown in FIGS. 4 and 5 was used for this verification. As seen in FIG. 13(*a*), the electrode width of the first sensing electrode 12 and the second sensing electrode 13 is set for 7 mm. The size of the shield electrode 14 surrounding both ends of the first and second sensing electrodes 12, 13 is set such that one side of the shield electrode 14 is 12 mm and the other side is 10 mm. The shield electrode 14 extending in the mounting portion 1*b* is omitted in FIG. 13(*a*). In this first verification, as a comparative example (control) shown in FIG. 13(*b*), there is employed a capacitive sensor having a shield electrode 14, which surrounds both ends of the first and second sensing electrodes 12, 13 but does not protrude, at both sides of the shield electrode 14, from the electrode surface of the first sensing electrode 12 toward the detecting surface P1.

In this verification, the detectable region of the capacitive sensor where a human body can be detected was determined by bringing a human body (finger) nearer to the capacitive sensor. More specifically, the determination of the detectable region was carried out by measuring the maximum distance between the human body and the capacitive sensor 1 at the time when the human body is detected. Electric potentials of the first and second sensing electrodes 12, 13 of the capacitive sensors shown in FIGS. 13(*a*) and 13(*b*) are set in 1.3 V. The verification results are shown in FIG. 13(*c*).

As is apparent from FIG. 13(*c*), when comparing the capacitive sensor (FIG. 13(*a*)) according to the present invention with the control capacitive sensor (comparative example shown in FIG. 13(*b*)), the sensitivity for detecting a human body is lowered at the side where the shield electrode 14 protrudes beyond the first sensing electrode 12, especially in the range of the direction angle between 0 to 60 degrees. On the other hand, at the side where the shield electrode 14 does not protrude beyond the electrode surface of the first sensing electrode 12, especially in the range of the direction angle between 120 to 210 degrees, the sensitivity for detecting a human body is kept within the allowable range.

As is obvious from this verification, since the sensitivity for detecting a human body is lowered to the range of the direction angle between 0 to 60 degrees according to the capacitive sensor of FIG. 13(*a*), it is possible to prevent a detection error such that the capacitive sensor detects a human body positioned at a peripheral position where the slide door 23 does not entrap the human body, for example, a human body X shown in FIG. 14 that positions outside the slide door 23. In other words, decreasing the sensitivity for detecting a human body can prevent a detection error of the entrapment prevention apparatus 3 shown in FIG. 6.

As seen in FIG. 14, when the slide door 23 is being closed, it slides along the vehicle body 24 and moves toward the vehicle body 24 to completely close the door. According to the capacitive sensor shown in FIG. 13(*a*), since the sensitivity for detecting a human body is kept within the allowable range in the range of the direction angle between 120 to 210 degrees, the capacitive sensor can reliably detect a human body Y shown in FIG. 14 that crosses over the traveling passage of the slide door 23.

Second Verification

Two capacitive sensors having the same construction as the capacitive sensor 1 shown in FIGS. 4 and 5 were used for this verification. As seen in FIG. 15(*a*), in the first capacitive sensor the electrode width of the first sensing electrode 12 and the second sensing electrode 13 is set for 9 mm. The size of the shield electrode 14 surrounding both ends of the first and second sensing electrodes 12, 13 is set such that one side of the shield electrode 14 is 12 mm and the other side is 10 mm. As seen in FIG. 15(*b*) the second capacitive sensor has substantially the same construction as the capacitive sensor shown in FIG. 15(*a*) except that the other side of the shield electrode 14 is set for 15 mm. In FIGS. 15(*a*) and 15(*b*), the shield electrode 14 extending in the mounting portion 1*b* is omitted. In this second verification, as a comparative example (control) shown in FIG. 15(*c*), there is employed a capacitive sensor having a shield electrode 14, which surrounds both ends of the first and second sensing electrodes 12, 13 but does not protrudes, at both sides of the shield electrode 14, from the electrode surface of the first sensing electrode 12 toward the detecting surface P1. In this comparative example, the electrode width of the first sensing electrode 12 and the second sensing electrode 13 is set for 7 mm.

In this verification, the detectable region of the capacitive sensor was determined by the same manner as the first verification as described above. Electric potentials of the first and second sensing electrodes 12, 13 of the capacitive sensors shown in FIGS. 15(*a*), 15(*b*) and 15(*c*) are set in 1.3 V. The verification results are shown in FIG. 15(*d*).

As is apparent from FIG. 15(*d*), when comparing the capacitive sensor (FIG. 15(*a*)) according to the present invention with the control capacitive sensor (comparative example shown in FIG. 15(*c*), the electrode width (electrode area) of the first and second sensing electrodes 12, 13 is large. This can retain the sensitivity for detecting a human body that approaches at the direction angle of 90 degrees against the detecting surface P1 (FIG. 5) of the capacitive sensor, while decreasing the sensitivity at the side where the shield electrode 14 protrudes from the first sensing electrode 12, especially in the range of the direction angle between 0 to 50 degrees.

Therefore, since the sensitivity for detecting a human body that approaches at the direction angle of 90 degrees is retained according to the capacitive sensor shown in FIG. 15(*a*), the capacitive sensor can reliable detect a human body (not shown) that positions across the traveling direction of the slide door 23 sliding along the vehicle body 24 to close the door. Further, according to the capacitive sensor of FIG. 15(*a*), since the sensitivity for detecting a human body is decreased in the range of the direction angle between 0 to 50 degrees, as with the capacitive sensor of FIG. 13(*a*), it is possible to prevent a detection error such that the capacitive sensor detects the human body X shown in FIG. 14. In other words, decreasing the sensitivity for detecting a human body X can prevent a detection error of the entrapment prevention apparatus 3 shown in FIG. 6.

Further, when comparing the capacitive sensor of FIG. 15(*b*) according to the present invention with the capacitive sensor of FIG. 15(*a*) according to the present invention, the shield electrode 14 protrudes further at the other side, decreasing the sensitivity for detecting a human body in the range of the direction angle between 20 to 80 degrees. Therefore, decreasing the sensitivity for detecting the human body X (FIG. 14) can prevent a detection error of the entrapment prevention apparatus 3 shown in FIG. 6.

As described above, unlike with the conventional capacitive sensor, the capacitive sensor 1 does not include an earth electrode. Therefore, even if a water droplet W sticks to the coating member 15, it is possible to prevent a detection error of the capacitive sensor 1 caused by the water droplet sticking to the periphery of the capacitive sensor 1.

The capacitive sensor 1 detects a human body by detecting the difference value between the electric potential of the first sensing electrode 12 and the electric potential of the second sensing electrode 13. Therefore, a change in the electric potential of the first sensing electrode 12 and a change in the electric potential of the second sensing electrode 13, which are caused by a water droplet W sticking to the sensor, can be compensated to each other by the detection of the difference value. This capacitive sensor 1 can thus prevent a detection error caused by the water droplet W sticking to the periphery of the sensor.

The capacitive sensor 1 includes the shield electrode 14, and the electric potential of the shield electrode 14 is set in the same electric potential as the first sensing electrode 12 and the second sensing electrode 13. Therefore, even if a human body approaches from the reverse side of the capacitive sensor 1, it is possible to prevent a detection error of the capacitive sensor 1 as if the human body is detected at the center pillar 21 side of the capacitive sensor 1, that is, at the door closing side of the slide door 23.

In this capacitive sensor 1, the shield electrode 14 protrudes from the electrode surface of the first sensing electrode 14 toward the detecting surface P1, so that at aside where the shield electrode 14 protrudes it is possible to decrease the sensitivity for detecting a human body. In other words, since the shield electrode 14 protrudes from the electrode surface of the first sensing electrode 12 at one side closer to the outside of the vehicle 2 (see FIG. 5), the capacitive sensor 1 does not detect a human body that exists in a position where the slide door 23 does not catch or entrap the human body.

Further, since one side of the shield electrode 14 that is close to the interior side of the vehicle 2 is shorter than the other side that is close to the outside of the vehicle 2 as seen in FIG. 5, the sensitivity for detecting a human body that exists in the interior side of the vehicle 2 can be kept within the allowable range. Therefore, when the slide door 23 shifts toward the vehicle body 24 to completely close the door, the capacitive sensor 1 can reliably detect a human body that exists in the interior side of the vehicle 2

The entrapment prevention apparatus 3 using the capacitive sensor 1 can prevent a disturbance caused by a water droplet W sticking to the capacitive sensor 1, and the shield electrode 14 also prevents a disturbance. Therefore, it is possible to prevent a detection error of the entrapment prevention apparatus 3, which prevents an entrapment of a human body.

According to the entrapment prevention apparatus 3 using the capacitive sensor 1, by adjusting the distance of the shield electrode 14 that protrudes from the electrode surface of the first sensing electrode 12 it is possible to optimize the sensitivity for detecting a human body. Therefore, the entrapment prevention apparatus 3 can reliably detect a human body and prevent an entrapment of the human body.

Figure 16:
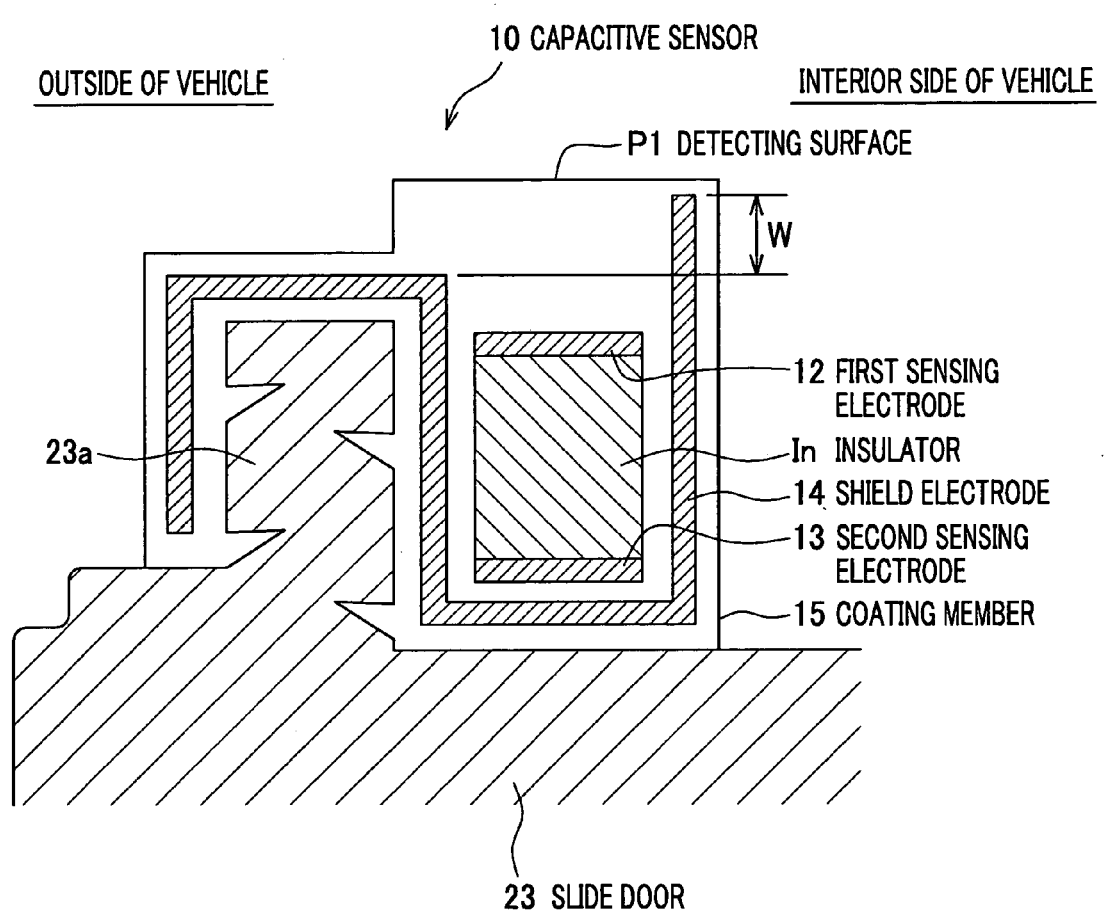
FIG. 16 is a cross sectional view of a capacitive sensor according to another embodiment of the present invention.

Although the present invention has been described above with reference to specific embodiments thereof, it is to be understood that various changes and modifications may be made without departing from the scope of the invention. For example, in the above preferred embodiments, the shield electrode 14 protrudes, atone side closer to the outside of the vehicle 2, from the electrode surface of the first sensing electrode 12 toward the detecting surface P1. However, the present invention is not limited to this specific arrangement. As shown in FIG. 16, there may be provided a capacitive sensor 10, in which the shield electrode 14 protrudes from the electrode surface of the first sensing electrode 12 at one side positioned inside the vehicle 2.

According to this capacitive sensor 10, when the slide door 23 is closed, the capacitive sensor 10 becomes closer to a position where a ground potential such as the center pillar 21 (FIG. 6) is installed. In this instance, since the shield electrode 14 protrudes, at a side closer to the center pillar 21, from the electrode surface of the first sensing electrode 12 toward the detecting surface P1, the electric potentials of the first and second sensing electrodes 12, 13 are not influenced by the parts such as the center pillar 21. Therefore, the capacitive sensor 10 can prevent a detection error at a position where the slide door 23 is completely closed.

Figure 17:
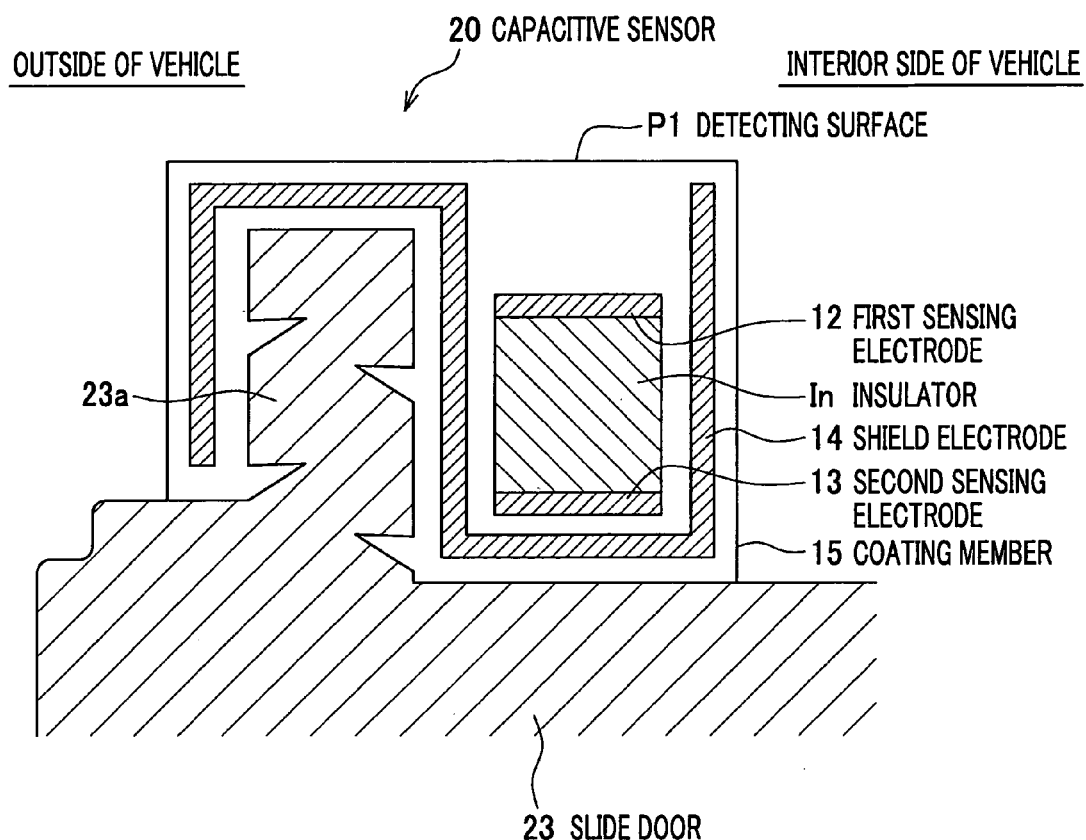
FIG. 17 is a cross sectional view of a capacitive sensor according to still another embodiment of the present invention.

Further, in the above embodiments, the shield electrode 14 surrounding both ends of the first sensing electrode 12 and the second sensing electrode 13 protrudes, at one side, from the electrode surface of the first sensing electrode 12 toward the detecting surface P1. However, the present invention is not limited to this specific arrangement. As shown in FIG. 17, there may be provided a capacitive sensor 20 wherein the shield electrode 14 protrude, at both sides positioned on both ends of the first and second sensing electrodes 12, 13, from the electrode surface of the first sensing electrode 12 toward the detecting surface P1.

Verification was made to determine the detectable region of the capacitive sensor 20 where a human body can be detected. The verification results will be described below with reference to the drawings.

As shown in FIG. 18, the capacitive sensor 20 used for this verification is set such that the electrode width of the first sensing electrode 12 and the second sensing electrode 13 is 7 mm. In this verification, as a comparative example (control), there is employed a capacitive sensor having a shield electrode 14, in which the length of the shield electrode 14 surrounding both ends of the first and second sensing electrodes 12, 13 is set for 10 mm at both sides thereof. On the contrary, two types of capacitive sensors 20 according to the present invention are used to verify the detectable region. To be more specific, the capacitive sensors 20 have the shield electrode 14, in which the length of the shield electrode 14 is increased for 2 mm and 5 mm, respectively from the comparative example with the length of 10 mm. In other words, the length of the one shield electrode 14 is 12 mm at both sides, and the length of the other shield electrode 14 is 15 mm at both sides. The electric potential of the first sensing electrode 12 and the electric potential of the second sensing electrode 13 are set in 1.3 V. The verification results are shown in FIG. 18(b).

As is apparent from FIG. 18(b), the detectable regions of these capacitive sensors 20 according to the present invention become small at the outer side of the slide door 23 (outside of the vehicle as shown in FIG. 17) and at the inside the vehicle (interior side of the vehicle as shown in FIG. 17). According to these capacitive sensors 20, it is possible to prevent a detection error such that the capacitive sensor 20 detects a human body that positions around the slide door 23 but is not entrapped by the slide door 23. As the result, the entrapment prevention apparatus 3 (FIG. 6) prevents a detection error caused by a human body approaching the slide door 23 from the outside or the interior side of the slide door 23 but not likely to cause an entrapment.

In the above preferred embodiments, the shield electrode 14 extends from the region of the main body 1a to the mounting portion 1b so as to surround the flange portion 23a of the slide door 23 as illustrated in FIG. 5. However, the present invention is not limited to this embodiment. As shown in FIG. 19A, the shield electrode 14 arranged in the mounting portion 1b may be separated from the shield electrode 14 arranged in the main body 1a.

According to this capacitive sensor, both sides of the shield electrode 14 can be set for an arbitrary length irrespective of the length of the shield electrode 14 arranged in the mounting portion 1b. Such an arrangement can also be applied to the capacitive sensor shown in FIG. 17, in which the shield electrode 14 protrudes at both sides positioned on both ends of the first and second sensing electrodes 12, 13. Example of this capacitive sensor is shown in FIG. 19B.

The fixing member to which is mounted the capacitive sensor 1 is not limited the slide door 23. The fixing member may be any opening/closing member automatically opened and closed by an automatic opening/closing device such as the door drive device 31. For example, the fixing member may be a hinge-type door, a gull-wing door, a back door, a trunk, and a sun roof.

Further, the installation position of the capacitive sensor 1 is not limited to the moving member such as the slide door 23. For example, the capacitive sensor 1 may be installed to the fixing member of the vehicle body such as the front door and the center pillar 51 (FIG. 7B).

What is claimed is:

1. A capacitive sensor comprising:
   a first sensing electrode connected to a first reference capacitor in which is stored reference electric charge;
   a second sensing electrode connected to a second reference capacitor in which is stored reference electric charge; and
   a shield electrode to which is applied electric potential equal to that of the first sensing electrode and the second sensing electrode,
   wherein the first sensing electrode is provided adjacent to a detecting surface of the capacitive sensor, and the second sensing electrode is provided opposite to the detecting surface in such a manner that the first and second sensing electrodes are spaced apart and facing to each other,
   wherein the shield electrode is configured to partly expose the first and second sensing electrodes on the side of the detecting surface, and
   wherein an extending portion of the shield electrode extends toward the detecting surface beyond an edge of the first sensing electrode at one side of the first and the second sensing electrodes, said edge being provided adjacent to the detecting surface.

2. A capacitive sensor according to claim 1, wherein the capacitive sensor is fixed to an opening/closing member attached to a vehicle body in such a manner that the first and the second sensing electrodes extend in a direction transverse of the opening/closing portion, and wherein the shield electrode protrudes from the first sensing electrode at one side closer to an outside of the vehicle body.

3. A capacitive sensor according to claim 1, wherein the capacitive sensor is fixed to an opening/closing member attached to a vehicle body in such a manner that the first and the second sensing electrodes extend in a direction transverse of the opening/closing portion, and wherein the shield electrode protrudes from the first sensing electrode at one side closer to an interior of the vehicle body.

4. An entrapment prevention apparatus comprising:
   an opening/closing member which is attached to a vehicle body and performs an opening/closing operation relative to the vehicle body;
   the capacitive sensor of claim 1 which is fixed to the opening/closing member;
   a difference detection circuit which detects a difference value between electric potential of the first sensing electrode and electric potential of the second sensing electrode of the capacitive sensor;
   a signal processing circuit which outputs a detection signal when the difference value to be detected is equal to or greater than a predetermined threshold difference value; and
   a drive device which stops or reversely moves the opening/closing member based on the detection signal outputted while the opening/closing member is moving relative to the vehicle body.

5. A capacitive sensor comprising:
first and second sensing electrodes which are spaced apart from each other, said first sensing electrode having first and second edges;
a shield electrode which is spaced from and surrounds the sensing electrodes; and
a coating member which holds the sensing electrodes and the shield electrode and which is made of an insulating material,
wherein the coating member includes a mounting portion for attaching the capacitive sensor to a fixing member,
wherein the mounting portion is provided with a core member, and a same electric potential is applied to the core member and the shield electrode,
wherein both the core member and an extending portion of the shield electrode extend toward the detecting surface beyond a second edge of the first sensing electrode, the second edge being provided opposite the first edge and adjacent to the detecting surface.

6. A capacitive sensor according to claim 5, wherein the core member is integral with the shield electrode.

7. A capacitive sensor according to claim 6, wherein the mounting portion includes a fitting groove for mounting the capacitive sensor to the fixing member, and wherein the shield electrode opens at a detecting surface and the core member and the fitting groove open at a side opposite to the detecting surface.

8. A capacitive sensor according to claim 5, wherein the shield electrode and the core member are made of metal.

9. A capacitive sensor according to claim 8, wherein the mounting portion includes a fitting groove for mounting the capacitive sensor to the fixing member, and wherein the shield electrode opens at a detecting surface and the core member and the fitting groove open at a side opposite to the detecting surface.

10. A capacitive sensor according to claim 5, wherein the mounting portion includes a fitting groove for mounting the capacitive sensor to the fixing member, and wherein the shield electrode opens at a detecting surface and the core member and the fitting groove open at a side opposite to the detecting surface.

11. A capacitive sensor according to claim 5, wherein the mounting portion includes a fitting groove defined between a portion of the core member that is perpendicular to the detecting surface and the shield electrode, said fitting groove being sized for insetting the fixing member within, wherein the fitting groove for inserting the fixing member extends towards the detecting surface to approximately the first edge of the first sensing electrode, the first edge being provided away from the detecting surface.

* * * * *